US010763814B2

(12) United States Patent
Brounley et al.

(10) Patent No.: US 10,763,814 B2
(45) Date of Patent: Sep. 1, 2020

(54) RADIO FREQUENCY PROCESSING APPARATUS AND METHOD

(71) Applicant: John Bean Technologies Corporation, Chicago, IL (US)

(72) Inventors: Richard R. Brounley, Clearwater, FL (US); Richard W. Brounley, Palm Harbor, FL (US); Richard Timperio, Catskill, NY (US)

(73) Assignee: John Bean Technologies Corporation, Chicago, IL (US)

( * ) Notice: Subject to any disclaimer, the term of this patent is extended or adjusted under 35 U.S.C. 154(b) by 341 days.

(21) Appl. No.: 15/673,229

(22) Filed: Aug. 9, 2017

(65) Prior Publication Data
US 2018/0062605 A1    Mar. 1, 2018

Related U.S. Application Data

(60) Provisional application No. 62/372,612, filed on Aug. 9, 2016.

(51) Int. Cl.
*H03H 7/38* (2006.01)
*H05B 6/46* (2006.01)
(Continued)

(52) U.S. Cl.
CPC ............. *H03H 7/38* (2013.01); *H01F 38/14* (2013.01); *H02P 8/40* (2013.01); *H05B 6/46* (2013.01);
(Continued)

(58) Field of Classification Search
CPC .. H01F 38/14; H02P 8/40; H05B 6/46; H05B 6/62; H05B 6/645; H05B 6/6467; H05B 6/687; H05B 6/782; H05B 6/688
(Continued)

(56) References Cited

U.S. PATENT DOCUMENTS 2,546,004 A * 3/1951 Kinn ................... H05B 6/78
                                                           219/776
3,446,929 A * 5/1969 Smith ................. H05B 6/782
                                                           219/696
(Continued)

FOREIGN PATENT DOCUMENTS

CA      2359226 A1    2/2003
CN    104957238 A    10/2015
(Continued)

OTHER PUBLICATIONS

Piyasena, P., et al., "Radio Frequency Heating of Foods: Principles, Applications, and Related Properties—A Review," Critical Reviews in Food Science and Nutrition, Feb. 2003, 22 pages.
(Continued)

*Primary Examiner* — Jimmy Chou
(74) *Attorney, Agent, or Firm* — Christensen O'Connor Johnson Kindness PLLC

(57) ABSTRACT

In an embodiment, an apparatus includes a radio frequency (RF) generator that is to generate a RF signal, first and second electrodes, and an impedance match module in series between the RF generator and the first electrode. The RF generator detects reflected power from the RF signal applied to a load electrically coupled between the first and second electrodes to change a temperature of the load, the RF signal to be applied to the load until the reflected power reaches a particular value.

20 Claims, 17 Drawing Sheets

(51) Int. Cl.
  *H05B 6/62* (2006.01)
  *H01F 38/14* (2006.01)
  *H02P 8/40* (2006.01)
  *H05B 6/64* (2006.01)
  *H05B 6/68* (2006.01)
  *H05B 6/78* (2006.01)

(52) U.S. Cl.
  CPC .............. *H05B 6/62* (2013.01); *H05B 6/645* (2013.01); *H05B 6/6467* (2013.01); *H05B 6/687* (2013.01); *H05B 6/688* (2013.01); *H05B 6/782* (2013.01); *H01F 2038/143* (2013.01)

(58) Field of Classification Search
  USPC ........................................................ 219/701
  See application file for complete search history.

(56) References Cited

U.S. PATENT DOCUMENTS

| | | | |
|---|---|---|---|
| 3,961,568 | A | 6/1976 | Jeppson |
| 3,974,353 | A * | 8/1976 | Goltsos .................. A47J 37/044 219/700 |
| 4,221,950 | A * | 9/1980 | Lamberts .................. B27N 3/24 156/274.6 |
| 4,289,792 | A | 9/1981 | Smith |
| 4,303,820 | A | 12/1981 | Stottmann et al. |
| 4,492,839 | A | 1/1985 | Smith |
| 4,567,340 | A * | 1/1986 | Latchum, Jr. ............ H05B 6/60 219/701 |
| 4,570,045 | A * | 2/1986 | Jeppson .................. H05B 6/782 219/699 |
| 4,972,059 | A | 11/1990 | Wendt et al. |
| 4,974,503 | A * | 12/1990 | Koch ........................ A23L 3/01 219/771 |
| 5,205,050 | A * | 4/1993 | Masaaki ............... B29B 13/021 219/697 |
| 5,553,532 | A * | 9/1996 | de la Luz-Martinez ...................... A21D 8/06 219/388 |
| 5,654,679 | A | 8/1997 | Mavretic et al. |
| 5,950,325 | A * | 9/1999 | Mehdizadeh ........... F26B 17/04 219/701 |
| 6,229,130 | B1 | 5/2001 | Furuta et al. |
| 6,246,040 | B1 * | 6/2001 | Gunn ....................... H05B 6/48 219/771 |
| 6,278,093 | B1 | 8/2001 | Iacovacci et al. |
| 6,303,166 | B1 | 10/2001 | Kolbe et al. |
| 6,426,477 | B1 * | 7/2002 | Koshimizu ....... H01J 37/32082 219/121.41 |
| 6,433,321 | B1 | 8/2002 | Lee et al. |
| 6,509,542 | B1 * | 1/2003 | Benjamin ......... H01J 37/32082 |
| 6,546,304 | B2 | 4/2003 | Thorvaldsson et al. |
| 6,552,296 | B2 | 4/2003 | Smith et al. |
| 6,603,352 | B2 | 8/2003 | Wight |
| 6,617,557 | B1 * | 9/2003 | Ryan .................. B29C 65/3676 219/634 |
| 6,618,957 | B2 * | 9/2003 | Novak ...................... A61L 2/12 34/259 |
| 6,657,173 | B2 | 12/2003 | Flugstad et al. |
| 6,677,828 | B1 | 1/2004 | Harnett et al. |
| 6,726,804 | B2 | 4/2004 | Wang et al. |
| 6,784,405 | B2 | 8/2004 | Flugstad et al. |
| 6,836,183 | B2 | 12/2004 | Wight |
| 6,914,226 | B2 * | 7/2005 | Ottaway .................. A21B 2/00 219/775 |
| 6,937,096 | B2 | 8/2005 | Wight et al. |
| 7,038,539 | B2 | 5/2006 | Khanifar et al. |
| 7,132,996 | B2 | 11/2006 | Evans et al. |
| 7,212,078 | B2 | 5/2007 | Windhorn |
| 7,268,634 | B2 | 9/2007 | Luong et al. |
| 7,288,987 | B2 | 10/2007 | Carichner et al. |
| 7,328,653 | B2 | 2/2008 | Tonello |
| 7,470,878 | B2 | 12/2008 | Yamamoto et al. |
| 7,652,541 | B2 | 1/2010 | Luong et al. |
| 7,801,493 | B2 | 9/2010 | Do |
| 7,883,609 | B2 | 2/2011 | Petrenko et al. |
| 7,928,339 | B2 | 4/2011 | Regere et al. |
| 8,338,761 | B2 | 12/2012 | Nordh et al. |
| 8,436,643 | B2 | 5/2013 | Mason |
| 8,456,267 | B2 | 6/2013 | Schoessow |
| 8,492,686 | B2 | 7/2013 | Bilchinsky et al. |
| 8,536,499 | B2 | 9/2013 | Richardson |
| 8,536,948 | B2 | 9/2013 | Kawai et al. |
| 8,653,482 | B2 | 2/2014 | Ben-Schmuel |
| 8,654,867 | B2 | 2/2014 | Hezar et al. |
| 8,659,237 | B2 | 2/2014 | Archenhold |
| 8,670,731 | B2 | 3/2014 | Kunihiro |
| 8,753,704 | B2 | 6/2014 | Roth et al. |
| 8,758,696 | B2 | 6/2014 | Grange et al. |
| 8,759,074 | B2 | 6/2014 | Grange et al. |
| 8,779,826 | B1 | 7/2014 | Chang et al. |
| 8,824,978 | B2 | 9/2014 | Griffa et al. |
| 8,941,040 | B2 | 1/2015 | Ben-Schmuel et al. |
| 9,065,426 | B2 | 6/2015 | Mason |
| 9,131,543 | B2 | 9/2015 | Ben-Schmuel et al. |
| 9,167,633 | B2 | 10/2015 | Ben-Schmuel et al. |
| 9,171,700 | B2 | 10/2015 | Gilmore |
| 9,239,188 | B2 | 1/2016 | Adrian et al. |
| 9,257,957 | B2 | 2/2016 | Song |
| 9,265,097 | B2 | 2/2016 | Torres et al. |
| 9,337,001 | B2 | 5/2016 | Ashida |
| 9,337,804 | B2 | 5/2016 | Mason |
| 9,398,644 | B2 | 7/2016 | Okajima |
| 9,450,541 | B2 | 9/2016 | Beltran Lizarraga et al. |
| 9,460,885 | B2 | 10/2016 | Richardson et al. |
| 9,545,735 | B2 | 1/2017 | Cervoni et al. |
| 9,715,996 | B2 | 7/2017 | Son |
| 2009/0236335 | A1 | 9/2009 | Ben-Schmuel et al. |
| 2009/0295509 | A1 | 12/2009 | Master et al. |
| 2011/0269085 | A1 * | 11/2011 | Wiker ...................... A21B 1/40 432/4 |
| 2012/0097665 | A1 | 4/2012 | Bilchinsky et al. |
| 2012/0114009 | A1 | 5/2012 | Melvin et al. |
| 2012/0152938 | A1 | 6/2012 | Nordh et al. |
| 2012/0228283 | A1 | 9/2012 | Ochoa Gonazalez et al. |
| 2013/0008895 | A1 | 1/2013 | Todd et al. |
| 2013/0080098 | A1 | 3/2013 | Hadad et al. |
| 2013/0105082 | A1 | 5/2013 | Melikyan et al. |
| 2013/0146590 | A1 | 6/2013 | Einziger et al. |
| 2013/0168386 | A1 | 7/2013 | Pfeiffer et al. |
| 2013/0175262 | A1 | 7/2013 | Gharpurey et al. |
| 2013/0316051 | A1 * | 11/2013 | van Der Voort ......... H05B 6/54 426/234 |
| 2014/0197761 | A1 * | 7/2014 | Grandemenge ...... H05B 6/6447 315/502 |
| 2014/0247060 | A1 | 9/2014 | Ben Haim et al. |
| 2015/0010679 | A1 | 1/2015 | Strong et al. |
| 2015/0017294 | A1 | 1/2015 | Shahram |
| 2015/0144621 | A1 | 5/2015 | Hong et al. |
| 2015/0312971 | A1 | 10/2015 | Ben-Schmuel et al. |
| 2015/0366006 | A1 | 12/2015 | Ben-Schmuel et al. |
| 2016/0213050 | A1 | 7/2016 | Van der Voort et al. |
| 2016/0235109 | A1 | 8/2016 | Cavestro |
| 2016/0331004 | A1 | 11/2016 | Strolenberg |
| 2017/0055557 | A1 | 3/2017 | Roberts et al. |
| 2017/0055761 | A1 | 3/2017 | Roberts et al. |
| 2017/0055766 | A1 * | 3/2017 | Grimaldi ............... A47J 37/015 |
| 2017/0055769 | A1 | 3/2017 | Grimaldi et al. |
| 2017/0065121 | A1 | 3/2017 | Roberts et al. |
| 2017/0071053 | A1 | 3/2017 | Lee et al. |
| 2017/0181455 | A1 | 6/2017 | Bullo et al. |
| 2017/0188417 | A1 | 6/2017 | Zhang et al. |
| 2017/0196050 | A1 | 7/2017 | Tang et al. |
| 2017/0202060 | A1 | 7/2017 | Tang et al. |
| 2017/0280518 | A1 | 9/2017 | Tang et al. |
| 2018/0042073 | A1 | 2/2018 | Scott et al. |
| 2018/0042074 | A1 | 2/2018 | Qiu et al. |
| 2018/0062605 | A1 * | 3/2018 | Brounley ............... H01F 38/14 |

(56) References Cited

U.S. PATENT DOCUMENTS

| | | |
|---|---|---|
| 2018/0138871 A1 | 5/2018 | Li et al. |
| 2018/0146518 A1 | 5/2018 | Ma et al. |

FOREIGN PATENT DOCUMENTS

| | | |
|---|---|---|
| EP | 1075799 A1 | 2/2001 |
| EP | 1340409 A2 | 6/2002 |
| EP | 0992059 B1 | 2/2003 |
| EP | 1471773 A2 | 10/2007 |
| EP | 2051564 A1 | 4/2009 |
| EP | 2322883 A1 | 5/2011 |
| EP | 2499880 A1 | 5/2011 |
| EP | 1831425 B1 | 7/2011 |
| EP | 2604090 A1 | 2/2012 |
| EP | 2163131 B1 | 3/2012 |
| EP | 2512206 A1 | 10/2012 |
| EP | 2718955 A1 | 12/2012 |
| EP | 2752086 A2 | 3/2013 |
| EP | 2658116 A1 | 10/2013 |
| EP | 2666371 B1 | 12/2014 |
| EP | 3005832 A1 | 12/2014 |
| EP | 2528415 B1 | 3/2015 |
| EP | 2544508 B1 | 6/2015 |
| EP | 3094190 A1 | 7/2015 |
| EP | 2337661 B1 | 3/2016 |
| EP | 2469975 B1 | 5/2016 |
| EP | 3060029 A1 | 8/2016 |
| EP | 3199873 A1 | 2/2017 |
| EP | 3151636 A1 | 4/2017 |
| EP | 3 280 224 A1 | 2/2018 |
| EP | 3 280 225 A1 | 2/2018 |
| FR | 2450502 A1 | 9/1980 |
| FR | 2520160 A1 | 7/1983 |
| FR | 2603444 A1 | 3/1988 |
| FR | 2715869 A1 | 8/1995 |
| GB | 1376744 A | 12/1974 |
| JP | 2009252346 A | 10/2009 |
| WO | 8604206 A1 | 7/1986 |
| WO | 02/45516 A2 | 6/2002 |
| WO | 0245516 A2 | 6/2002 |
| WO | 2004040985 A1 | 5/2004 |
| WO | 2008/115226 A2 | 9/2008 |
| WO | 2010054277 A1 | 5/2010 |
| WO | 2010108273 A1 | 9/2010 |
| WO | 2011/058038 A1 | 5/2011 |
| WO | 2012/019756 A1 | 2/2012 |
| WO | 2011/004597 A1 | 12/2012 |
| WO | 2012/168695 A1 | 12/2012 |
| WO | 2013/033330 A3 | 3/2013 |
| WO | 2014/191799 A1 | 12/2014 |
| WO | 2015/107100 A1 | 7/2015 |
| WO | 2016/196939 A2 | 12/2015 |
| WO | 2016/132260 A1 | 8/2016 |
| WO | 2017/017407 A1 | 2/2017 |
| WO | 2017/040626 A1 | 3/2017 |
| WO | 2017/040631 A1 | 3/2017 |
| WO | 2017040626 A1 | 3/2017 |
| WO | 2017/089471 A1 | 6/2017 |

OTHER PUBLICATIONS

Llave, Y., et al., "Dielectric properties of frozen tuna and analysis of defrosting using a radio-frequency system at low frequencies," Journal of Food Engineering 139, pp. 1-9, 2014.

Rowley, A.T., "Radio Frequency Heating," EA Technology Ltd, Chester, 2017, 16 pages.

Bedane, T.F., et al., "Experimental study of radio frequency (RF) thawing of foods with movement on conveyor belt," Journal of Food Engineering 201, pp. 17-25, 2017.

Stalam, "'RF' Meat & Fish Defrosting," 2010, 2 pages.

International Search Report and Written dated mailed Jan. 21, 2019, issued in corresponding International Application No. PCT/US2018/053802, filed Oct. 1, 2018, 20 pages.

International Search Report and Written Opinion dated Feb. 14, 2019, issued in corresponding International Application No. PCT/US2018/053797, filed Oct. 1, 2018, 21 pages.

International Search Report dated Nov. 13, 2017, issued in corresponding International Application No. PCT/US2017046155, filed Aug. 9, 2017, 12 pages.

Brounley, R. R. and Brounley R. W., "Radio Frequency Thawing Device," U.S. Appl. No. 32/372,612, filed Aug. 9, 2016, 11 pages.

NXP SDS31300 Smart Defrost RF Module Reference Design, NXP B.V., Jan. 2018, 2 pages.

NXP Smart Defrost Application Reference Design, NXP B.V., Jan. 2018, 2 pages.

Maloney, Norman, "Radio Frequency Heating," C-Tech Innovation, 2018 <http://www.ctechinnovation.com/rf-heating/> [retrieved Jul. 31, 2018], 4 pages.

International Preliminary Report on Patentability, dated Dec. 20, 2019, issued in corresponding International Application No. PCT/US2018/053802, filed Oct. 1, 2018, 9 pages.

International Preliminary Report on Patentability, dated Dec. 20, 2019, issued in corresponding International Application No. PCT/US2018/053797, filed Oct. 1, 2018, 12 pages.

\* cited by examiner

RADIO FREQUENCY PROCESSING APPARATUS AND METHOD

CROSS-REFERENCE TO RELATED APPLICATION

This application claims the benefit of U.S. Provisional Patent Application No. 62/372,612, filed Aug. 9, 2016, the entire disclosure of which is hereby incorporated by reference herein.

BACKGROUND

The background description provided herein is for the purpose of generally presenting the context of the disclosure. Unless otherwise indicated herein, the materials described in this section are not prior art to the claims in this application and are not admitted to be prior art or suggestions of the prior art, by inclusion in this section.

Materials may be processed using different techniques depending on the type of material, desired end product, quantity of material, energy constraints, interim control constraints, cost constraints, and the like. For example, for biologic material, and in particular, food material, processing may comprise causing food material to be heated using RF energy. While frozen food material may be placed in an area of higher temperature (e.g., from freezer to refrigerator) to passively heat over time, such process may require too long a time period, the end product may be non-uniform, and/or the end product have other undesirable characteristics.

Conversely, frozen food material may be actively heated using, for example, radio frequency (RF) heating techniques. An example RF heating technique may comprise heating the food material at high frequencies, such as frequencies of 13.56 MegaHertz (MHz) to 40.68 MHz. Using such high frequencies, however, may result in lack of uniformity in the heating due to low penetration depth of high frequency radiation. Another example RF heating technique may be implemented using large vacuum tube systems operating at 27 MHz. In such systems, the vacuum tubes may comprise a free running oscillator having a frequency range which may deviate from 27 MHz and may also deviate from Federal Communications Commission (FCC) frequency requirements. Performance characteristics (e.g., power characteristics) of vacuum tubes also tend to degrade as soon as they are put into operation, with vacuum tube lifespans lasting on average a mere two years. Such vacuum tube systems may also operate at several thousand volts, which raise safety concern for nearby personnel, especially since these systems operate in an environment where water or moisture may be present. In other example RF heating techniques, the direct current (DC) to RF power efficiency may be 50% or less.

Accordingly, processing techniques which address one or more of personnel safety concerns, uniformity in the state of the end product, power efficiency, processing control, compact system size, lower energy requirements, system robustness, lower cost, system adjustability, and/or the like may be beneficial.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In some embodiments, a system includes a plurality of radio frequency (RF) generators; a plurality of impedance match modules; a plurality of electrode plates, first and second impedance match modules of the plurality of impedance match modules electrically coupled between respective first and second RF generators of the plurality of RF generators and respective first and second electrode plates of the plurality of electrode plates; and a conveyor including a ground electrode. When a load at a start temperature is to be placed on the conveyor, the system uses RF signals generated by the plurality of RF generators to cause the load to be at an end temperature different from the start temperature, wherein the conveyor is to position the load to electrically couple to the first electrode plate during a first time period and the first impedance match module is associated with a first range of temperatures between the start and end temperatures, and wherein the conveyor is to position the load to electrically couple to the second electrode plate during a second time period and the second impedance match module is associated with a second range of temperatures between the start and end temperatures that is different from the first range of temperatures.

In some embodiments, a method includes positioning a load to electrically couple with a first electrode plate for a first time period, wherein a first impedance match module is electrically coupled between the first electrode plate and a first radio frequency (RF) generator, and wherein the first impedance match module is associated with a first range of temperatures between a start temperature and an end temperature associated with the load; applying a first RF signal to the load for a portion of the first time period during which the load is at a temperature within the first range of temperatures, the first RF signal comprising a RF signal generated by the first RF generator and impedance matched by the first impedance match module; positioning the load to electrically couple with a second electrode plate for a second time period, wherein a second impedance match module is electrically coupled between the second electrode plate and a second RF generator, and wherein the second impedance match module is associated with a second range of temperatures between the start and end temperatures different from the first range of temperatures; and applying a second RF signal to the load for a portion of the second time period during which the load is at a temperature within the second range of temperatures, the second RF signal comprising another RF signal generated by the second RF generator and impedance matched by the second impedance match module.

In some embodiments, an apparatus includes means for positioning a load to electrically couple with a first electrode plate for a first time period, wherein a first means to match impedance is electrically coupled between the first electrode plate and a first radio frequency (RF) generator, and wherein the first means to match impedance is associated with a first range of temperatures between a start temperature and an end temperature associated with the load; means for applying a first RF signal to the load for a portion of the first time period during which the load is at a temperature within the first range of temperatures, the first RF signal comprising a RF signal generated by the first RF generator and impedance matched by the first means to match impedance; means for positioning the load to electrically couple with a second electrode plate for a second time period, wherein a second means to match impedance is electrically coupled between the second electrode plate and a second RF generator, and wherein the second means to match impedance is associated with a second range of temperatures between the start and end temperatures different from the first range of temperatures; and means for applying a second RF signal to the load for a portion of the second time period during which the load is at a temperature within the second range of temperatures, the second RF signal comprising another RF signal generated by the second RF generator and impedance matched by the second means for matching impedance.

In some embodiments, a device includes a first capacitor in parallel with an inductor; primary windings of a transformer in series with the first capacitor and the inductor; and a second capacitor in series with secondary windings of the transformer, wherein a radio frequency (RF) input signal is applied to the first capacitor and the primary windings of the transformer outputs a RF output signal, and wherein an impedance associated with the device is to match an impedance associated with a load in series with the device.

In some embodiments, an apparatus includes a first capacitor in parallel with an inductor; primary windings of a transformer in series with the first capacitor and the inductor; and a second capacitor in series with secondary windings of the transformer, wherein the primary and secondary windings comprise flat conductive strips, and the transformer comprises the primary windings wound around an outer circumferential surface of a tube and the secondary windings wound around an inner circumferential surface of the tube.

In some embodiments, a method includes changing capacitance of one or both of first and second capacitors included in an impedance match module in series between a radio frequency (RF) generator and a load, wherein the change is initiated in accordance with a first reflected power level, and wherein the first capacitor is in parallel with an inductor, primary windings of a transformer is in series with the first capacitor and the inductor, and the second capacitor is in series with secondary windings of the transformer; and generating a RF output signal based on a RF signal received from the RF generator and in accordance with the changed capacitance of the first and second capacitors in the impedance match module, wherein a second reflected power level at a time after the first reflected power level is less than the first reflected power level.

In some embodiments, an apparatus includes a control module; an oscillator module that is to convert a direct current (DC) signal into a radio frequency (RF) signal; a power amplifier module coupled to an output of the oscillator module, the power amplifier module is to amplify a power associated with the RF signal in accordance with a bias signal from the control module to generate an amplified RF signal; and a directional coupler module coupled to an output of the power amplifier module, the directional couple module is to detect at least a reflected power and to provide the detected reflected power to the control module, wherein the control module is to generate the bias signal based on the detected reflected power and is to provide the detected reflected power as an available monitored output of the apparatus.

In some embodiments, a method includes converting a direct current (DC) signal into a radio frequency (RF) signal; amplifying a power associated with the RF signal in accordance with a bias signal from a control module to generate an amplified RF signal; detecting at least a reflected power and providing the detected reflected power to the control module; and generating the bias signal based on the detected reflected power and providing the detected reflected power as an available monitored output.

In some embodiments, an apparatus includes means for converting a direct current (DC) signal into a radio frequency (RF) signal; means for amplifying a power associated with the RF signal in accordance with a bias signal from a means for controlling to generate an amplified RF signal; means for detecting at least a reflected power and providing the detected reflected power to the means for controlling; and means for generating the bias signal based on the detected reflected power and providing the detected reflected power as an available monitored output.

In some embodiments, an apparatus includes a radio frequency (RF) generator that is to generate a RF signal; first and second electrodes; and an impedance match module in series between the RF generator and the first electrode, wherein the RF generator detects reflected power from the RF signal applied to a load electrically coupled between the first and second electrodes to change a temperature of the load, the RF signal to be applied to the load until the reflected power reaches a particular value.

In some embodiments, a method includes applying a radio frequency (RF) signal to a load; monitoring a reflected power level associated with an apparatus including a direct current (DC) source, an impedance match module, a radio frequency (RF) generator, and the load; and determining a temperature of the load based on the reflected power level.

DESCRIPTION OF THE DRAWINGS

The foregoing aspects and many of the attendant advantages of the present disclosure will become more readily appreciated as the same become better understood by reference to the following detailed description, when taken in conjunction with the accompanying drawings.

DETAILED DESCRIPTION

Figure 1:
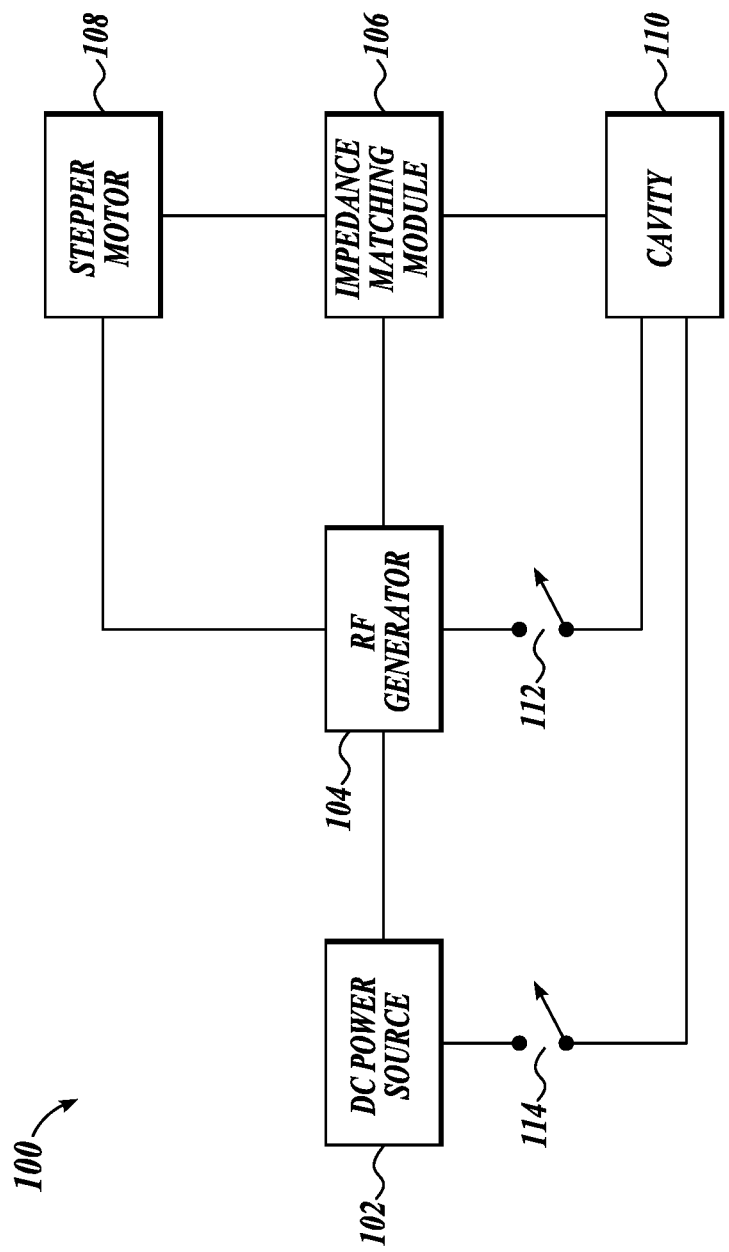
FIG. 1 depicts a block diagram of an example radio frequency (RF) processing system incorporating aspects of the present disclosure, according to some embodiments.

Embodiments of apparatuses and methods related to radio frequency (RF) processing are described. In embodiments, a system includes a plurality of radio frequency (RF) generators; a plurality of impedance match modules; a plurality of electrode plates, first and second impedance match modules of the plurality of impedance match modules electrically coupled between respective first and second RF generators of the plurality of RF generators and respective first and second electrode plates of the plurality of electrode plates; and a conveyor including a ground electrode. When a load at a start temperature is to be placed on the conveyor, the system uses RF signals generated by the plurality of RF generators to cause the load to be at an end temperature different from the start temperature, wherein the conveyor is to position the load to electrically couple to the first electrode plate during a first time period and the first impedance match module is associated with a first range of temperatures between the start and end temperatures, and wherein the conveyor is to position the load to electrically couple to the second electrode plate during a second time period and the second impedance match module is associated with a second range of temperatures between the start and end temperatures that is different from the first range of temperatures. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

FIG. 1 depicts a block diagram of an example radio frequency (RF) processing system 100 incorporating aspects of the present disclosure, according to some embodiments. As described in detail below, system 100 may be configured to uniformly heat a material of interest from a start temperature to an end temperature. In some embodiments, the start temperature may comprise a commercial storage temperature of the material of interest. For example, the commercial storage temperature (also referred to as a commercial cold storage temperature) may comprise a temperature associated with the material of interest being in a frozen state such as, but not limited to, at −40 degree Celsius (° C.), −20° C., −10° C., less than −40° C., and/or the like. The end temperature may comprise a temperature below 0° C., −2° C., −3° C., −2° C.±1° C., between −4 to −2° C., a temperature below at which the material of interest undergoes a phase change from a solid (e.g., frozen) to liquid, a temperature below at which drip loss of the material of interest may occur, a temperature higher than the start temperature at which system 100 may be configured to end processing of the material of interest, and/or the like. System 100 may also be referred to as a heating system, a melting system, a tempering system, a dielectric heating system, and/or the like.

System 100 may include a direct current (DC) power source 102, a RF generator 104, an impedance matching module 106, a stepper motor 108, a cavity 110, a switch 112, and a switch 114. The output of the DC power source 102 may be coupled to the input of the RF generator 104, the output of the RF generator 104 may be coupled to the input of the impedance matching module 106, and the output of the impedance matching module 106 may be coupled to the input of the cavity 110. Stepper motor 108 may be coupled to each of the RF generator 104 and the impedance matching module 106. Switch 112 may be disposed between RF generator 104 and cavity 110, and switch 114 may be disposed between DC power source 102 and cavity 110.

DC power source 102 may comprise the power source for the system 100. In some embodiments, DC power source 102 may be operable, without limitation, between 0 to 3000 Watt (W), 0 to 5000 W, or the like. As an example, DC power source 102 may be configured for operation at 2000 W and to provide a 42 Volt (V) DC input signal to the RF generator 104.

RF generator 104 may be configured to convert the DC signal received from the DC power source 102 into an alternating current (AC) signal having a particular frequency. RF generator 104 may also be configured to provide one or more control functionalities such as, but not limited to, thermal shutdown protection, voltage standing wave ratio (VSWR) foldback protection, DC current limiting protection, endpoint detection, and forward and reflected power level detection, to be described in detail below. In some embodiments, RF generator 104 may comprise an air-cooled high-powered RF generator using solid state transistors, such as laterally diffused metal oxide semiconductor (LD-MOS) transistors; have a dynamic power range of 0 to 10 kiloWatt (kW); a frequency range of approximately 13 MegaHertz (MHz) to 100 MHz; capable of frequency stability of ±0.005% at least at 27.12 MHz; a harmonic output of at least −40 dBc (at least 40 decibels lower relative to carrier); and dimensions of approximately 20 centimeter (cm)×13.5 cm×40 cm. Continuing the example above, RF generator 104 may operate at a forward power of between 0 to 10 kW; have a 50 Ohm (Ω) output impedance; and output an AC signal at a frequency of 27.12 MHz, 27 MHz, approximately 27 MHz, between 13 to 100 MHz, at a RF frequency that is not a resonant frequency associated with the cavity 110, or the like.

Impedance matching module 106, also referred to as an impedance match module, may comprise a component configured to match (or nearly match) the output impedance associated with the RF generator 104 to an impedance associated with a load of the system 100. In some embodiments, the load may comprise a combination of the cavity 110 and the material to be thermally processed (also referred to as the material of interest or load) included in the cavity 110. The impedance associated with the load may be less than or otherwise differ from an output impedance associated with the RF generator 104. Each temperature of the load (e.g., the material of interest) may be associated with a particular impedance value. As the load temperature changes, as would during processing of the material of interest such as heating of the material of interest, the impedance associated with the load changes over time. Thus, in some embodiments, impedance matching module 106 may be configured for dynamic or variable impedance matching capabilities to take into account the changes in load impedance during processing. The impedance matching values associated with the impedance matching module 106 may be changed or adjusted one or more times in real-time, near real-time, and/or continuously during processing of the material of interest in the cavity 110, as described in detail below.

Stepper motor 108 may be configured to receive at least an indication of detected reflected power values from the RF generator 104, and dynamically control the capacitance values of the impedance matching module 106 in accordance with the indicated reflected power values. Stepper motor 108 may include, without limitation, in addition to one or more stepper motors, one or more controllers, circuitry, processors, or other logic configured to receive the indication of detected reflected power values, determine appropriate change (if any) to the capacitance values of the impedance matching module 106 based on the indication of detected reflected power values, and actuation of physical change(s) to the capacitors included in the impedance matching module 106 to affect the capacitance change. Stepper motor 108 may alternatively comprise a variety of other mechanisms capable of mechanically moving variable capacitors to change capacitance by a specific amount (e.g., tuning variable capacitors to a particular capacitance value).

The reflected power may comprise the difference between the forward power (outputted by the RF generator 104) and the load power (the portion of the forward power actually delivered to the load). When the impedance matching module 106 provides a perfect impedance match between the RF generator 104 and the load, the reflected power level may be zero. Conversely, when the there is a mismatch in the impedance matching provided by the impedance matching module 106, the reflected power level may be greater than zero. Generally, the greater the reflected power level, the greater the amount of impedance mismatch.

Cavity 110 may include, without limitation, at least an electrode, a grounding electrode, and an area between the electrode and grounding electrode in which material of interest may be located during processing. Cavity 110 may also be referred to as a housing, box, tunnel, load cavity, conveyor belt, belt, or other structure(s) in which the material of interest may be located or positioned and which permits the material of interest to be selectively electrically coupled to the rest of the system 100. As described in detail below, cavity 110 may be configured to handle a plurality of sizes of the material of interest. For example, the material of interest may have a height of approximately 5 inches, 6 inches, 9 inches, 12 inches, less than 5 inches, approximately 5-12.5 inches, and/or the like. In some embodiments, cavity 110 may include a door, from which the material of interest may be inserted or removed from the cavity 110.

In some embodiments, switches 112 and 114 may comprise safety features included in the system 100. When system 100 is in an "on" state and the door is in a closed position, switches 112 and 114 may be configured in a closed position and RF energy may accordingly be provided to the cavity. Conversely, when the door included in the cavity 110 is open—while the system 100 is in the "on" or "off" state—switches 112 and 114 may be configured to change to an open position, thereby creating open circuit(s) and interrupting or stopping flow of (potential) DC output from the DC power source 102 and (potential) RF output from the RF generator 104. Switches 112 and 114 may thus serve as double safety measures. Alternatively, one of switches 112 or 114 may be sufficient to prevent inadvertent RF irradiation, such as of personnel in proximity to the system 100.

In some embodiments, the Q (ratio of the reactance to the resistive component) associated with system 100 may comprise a high value, such as 400. The power lost in the impedance match provided by the impedance matching module 106 may be approximately 50 W for the 1250 W RF signal, which comprises a 4% or less than 5% power loss associated with the impedance match.

In some embodiments, materials which may be processed in the system 100 may include, without limitation, one or more of the following: food; biologic material; protein; meats; poultry (e.g., chicken, turkey, quail, duck); beef; pork; red meat; lamb; goat meat; rabbit; seafood; foods encased in one or more bags, plastic, cardboard, can, and/or container (e.g., raw poultry, beef, pork, or seafood products inside a vacuum sealed bag and which may, in turn, be packed in cardboard boxes); various cuts of beef (e.g., sirloin, shoulder, trimmings, chuck, brisket, round, ribs, cheek, organs, flank, skirt, bone-in cuts of beef); various cuts of pork (e.g., butt, shoulder, loin, ribs, ham, trimmings, cheek, bacon, bone-in cuts of pork); various cuts of poultry (e.g., strips, breasts, wings, legs, thighs, bone-in cuts of poultry); whole or portions of seafood (e.g., fish, salmon, tilapia, tuna, cod, halibut, haddock, octopus, shellfish (with shell on or off), crab, lobster, clams, mussels, crawfish, shrimp (shell on or off)); carbohydrates; fruits; vegetables; bakery goods; pastries; dairy; cheese; butter; cream; milks; eggs; juices; broths; liquids; soups; stews; grains; foods that are combinations of one or more of the above (e.g., pizza, lasagna, curry); non-food materials; plastics; polymers; rubbers; metals; ceramics; wood; soil; adhesives; materials having a dielectric constant in the range of approximately 1 to 80 (e.g., dielectric constant of frozen protein at −20° C. may be 1.3, dielectric constant of frozen protein at −3° C. may be 2 or 2.1, etc.); and/or the like. Examples of material that may be processed by system 100 include, without limitation, 40 pound block of frozen meat, whole frozen tuna, and the like.

In some embodiments, system 100 may be configured to perform other processes such as, but not limited to, sterilization, pasteurization, curing, drying, heating, and/or the like. For example, system 100 may be configured to dry grains, soften butter or cheese blocks, control moisture content of baked goods, or heat up food products such as ready meals.

Figure 2:
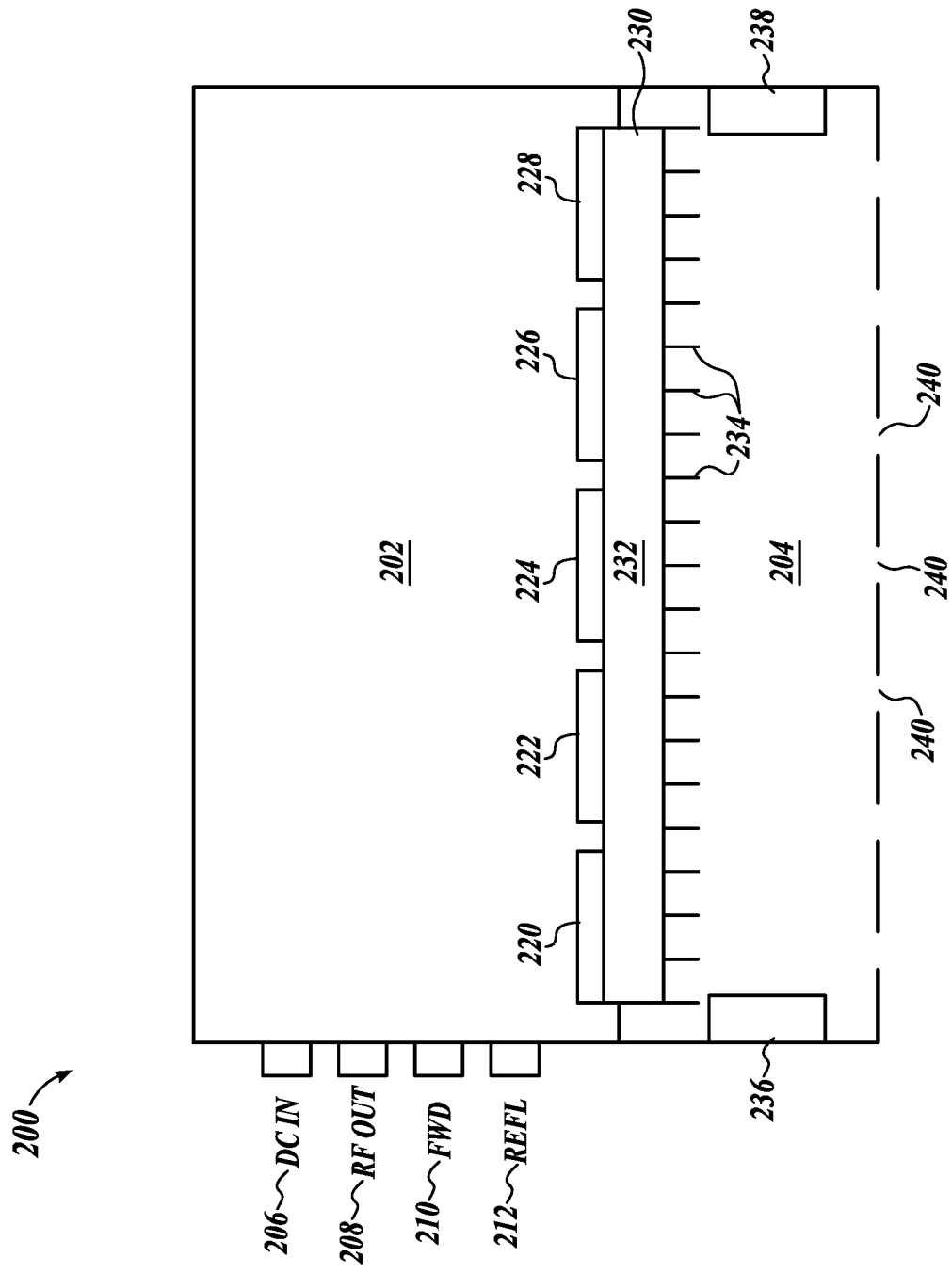
FIG. 2 depicts a cross-sectional view of an example of the RF generator, according to some embodiments.

FIG. 2 depicts a cross-sectional view of an example of the RF generator 104, according to some embodiments. RF generator 104 may comprise a housing 200 having a first chamber 202 and a second chamber 204. First and second chambers 202, 204 may also be referred to as first and second compartments. First chamber 202 may include a plurality of connectors or couplers configured to be the inputs and outputs of the RF generator 104. In some embodiments, the plurality of connectors/couplers may comprise, without limitation, a DC input connector 206 (to receive the output of the DC power source 102), a RF output connector 208 (to output the RF signal generated by the RF generator 104), a forward power connector 210 (to provide as an output indications of the detected forward power level), and a reflected power connector 212 (to provide as an output indications of the detected reflected power level). The plurality of connectors may comprise, for example, coaxial connectors.

First chamber 202 may also include a plurality of printed circuit boards (PCBs) 220-228, in which each PCB of the plurality of PCBs may be configured to include a particular circuitry (and/or hardware or firmware) of the RF generator 104. In some embodiments, the plurality of PCBs may comprise, without limitation, a control PCB 220, a directional coupler PCB 222, a RF power amplifier (RFPA) PCB 224, an oscillator or driver PCB 226, and a voltage regulator PCB 228. The various circuits may be located on different PCBs from each other and the plurality of PCBs may also be spaced apart from each other within the first chamber 202 for electrical isolation. In the presence of high and low power circuits, having common ground planes among such circuits may be avoided by placing the circuits on separate PCBs. Alternatively, more than one circuit may be included in a single PCB. For example, two or more of the control, directional coupler, RFPA, oscillator, and voltage regulator circuitry may be provided on a single PCB. More or fewer than five PCBs may be included in the first chamber 202. The electrical connections between the plurality of connectors and PCBs are not shown in FIG. 2 for ease of illustration.

In some embodiments, first chamber 202 may comprise an air tight or sealed chamber sufficient to protect the electronic components of the RF generator 104 (e.g., PCBs 220-228) from debris, dirt, moisture, and/or other contaminants which may otherwise enter and damage such electronic components.

In some embodiments, PCBs 220-228, such as the bottoms of the PCBs 220-228, may be in physical contact with a heatsink 230 to facilitate heat dissipation. Heatsink 230 may include a substrate 232 (which may optionally include tubing and/or other heat dissipation structures) and a plurality of fins 234. Substrate 232 may comprise copper and the plurality of fins 234 may comprise aluminum. Heatsink 230 may be partially located in each of the first and second chambers 202, 204. For instance, at least a major surface of the substrate 232 may protrude into or be co-planar with a side of the first chamber 202, so that the PCBs 220-228 may be in physical contact with the substrate 232, and at least the plurality of fins 234 may be located within the second chamber 204. Heatsink 230 may comprise one or more heatsinks.

In addition to the plurality of fins 234 located in the second chamber 204, second chamber 204 may also include one or more fans, such as fans 236 and 238, to provide forced air cooling. Alternatively, fans 236 and 238 may be optional if sufficient heat dissipation may be achieved without active air circulation. In some embodiments, second chamber 204 need not be air tight or sealed, and may include a plurality of vents 240 at one or more sides (e.g., cutouts in the side(s) of the housing 200 coincident with the second chamber 204) to facilitate heat dissipation.

Figure 3:
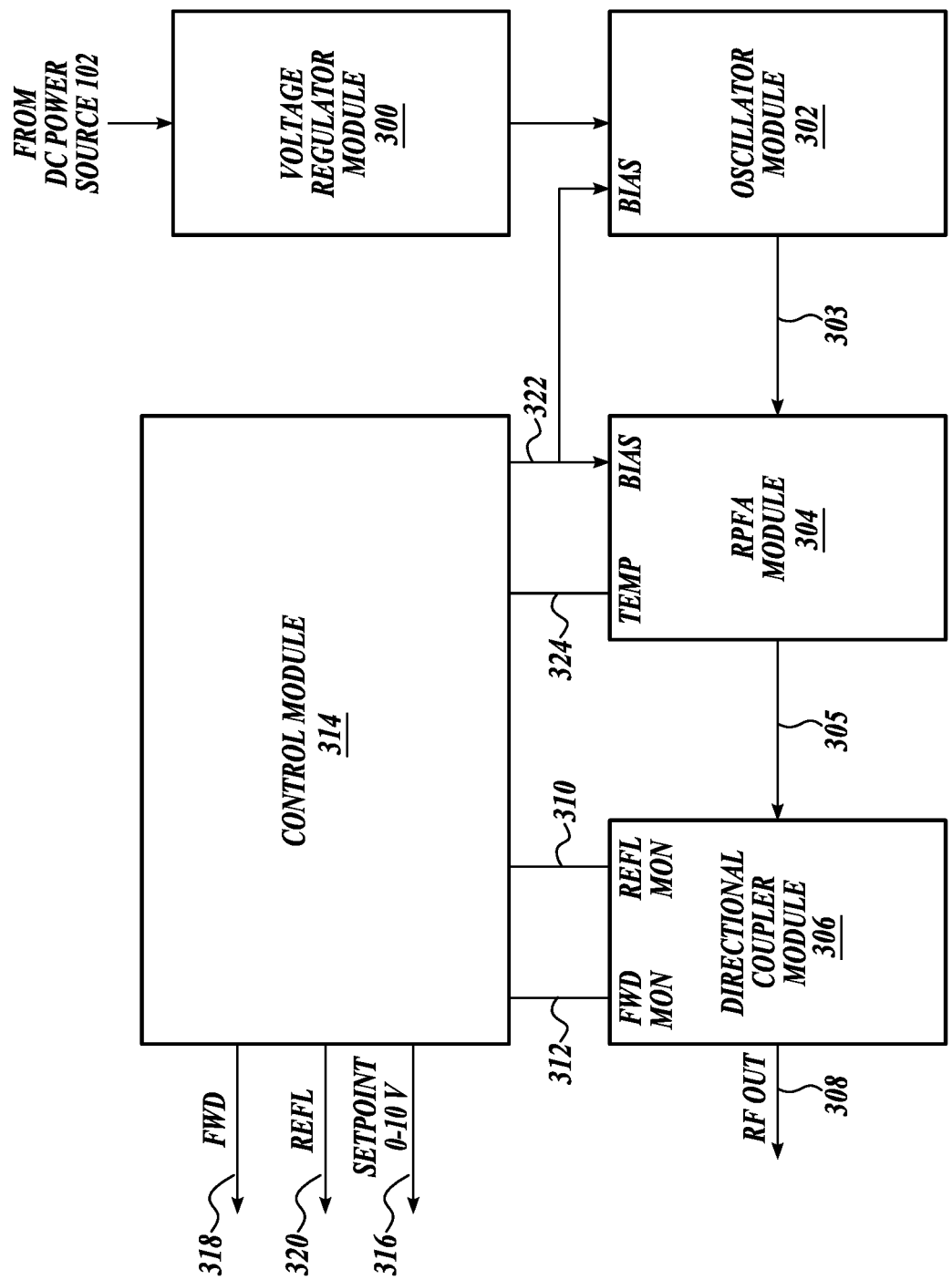
FIG. 3 depicts a block diagram of an example of the RF generator, according to some embodiments.

FIG. 3 depicts a block diagram of an example of the RF generator 104, according to some embodiments. RF generator 104 may include, without limitation, a voltage regulator module 300, an oscillator module 302, a RFPA module 304, a directional coupler module 306, and a control module 314. In some embodiments, modules 300, 302, 304, 306, 314 may be included respectively in PCBs 228, 226, 224, 222, 220.

In some embodiments, the DC signal outputted by the DC power source 102 may comprise the input to the voltage regulator module 300. Voltage regulator module 300 may be configured to reduce the received DC signal to a lower voltage signal. For example, if the received DC signal comprises 40 V, voltage regulator module 300 may reduce such signal to a 15 V DC signal. In some embodiments, voltage regulator module 300 may comprise film resistor voltage regulators. The output of the voltage regulator module 300 may be provided to each of the oscillator module 302 and the control module 314.

Oscillator module 302 may be configured to convert the reduced or stepped down DC signal to an AC signal at a particular RF frequency. The particular RF frequency may be "fixed" or set in accordance with a particular crystal included in the oscillator module 302. Oscillator module 302 may also be referred to as an exciter, driver, RF exciter, RF oscillator, RF driver, or the like. The RF signal outputted by the oscillator module 302 (RF signal 303) may then be provided to the RFPA module 304.

RFPA module 304 may be driven or controlled based on a bias signal 322 from the control module 314. In some embodiments, bias signal 322 may range between 0 to 4 V. Bias signal 322 may also be provided to the oscillator module 302. RFPA module 304 may be configured to amplify the power of the received RF signal in an amount in accordance with the amount of applied bias (e.g., the value of the bias signal 322). The amount of power amplification or gain provided by the RFPA module 302 may be a function of the value of the bias signal 322. In some embodiments, RFPA module 302 may include high gain transistors, such as four LDMOS transistors, configured to amplify the power of the RF signal received from the oscillator module 302 by a gain of approximately 28 decibel (dB). For instance, the RF signal 303 received from the oscillator module 302 may comprise a signal of approximately 4 to 6 W. Each of the high gain transistors may be configured to use approximately 1 to 1.5 W of the RF signal 303 to output about 300 W. Thus, the high gain transistors (and the RFPA module 304 overall) may collectively amplify about 4 to 6 W to about 1250 W, less than about 1250 W, higher than about 1250 W, a range of 0 to 1250 W (depending on the amount of bias applied to the RFPA module 304), and/or the like. The RF signal 305 outputted from the RFPA module 304 to the directional coupler module 306 may thus comprise a RF signal having the desired power amplification.

RF signal 305 received by the directional coupler module 306 may comprise the RF generator output signal 308 (also referred to as the RF output or RF out), which may be outputted by the directional coupler module 306 to the impedance matching module 106. In some embodiments, directional coupler module 306 may be configured to detect the forward and reflected power levels of the system 100. The RF voltage level or value associated with each of the forward and reflected power may be detected, monitored, or measured continuously, in real-time, or in near real-time. The higher the voltage value, the higher the power level. Directional coupler module 306 may be considered to be a power meter or detector for at least this functionality. The monitored forward and reflected power levels, or indications of the monitored forward and reflected power levels, may be provided by the directional coupler module 306 to control module 314. For example, signals 310, 312 associated with the monitored forward and reflected power levels provided to the control module 314 may comprise small voltage signals that are proportional to the actual forward and reflective power levels detected, respectively. Zero to 2.5 V may represent 0 to approximately 90 W, for instance. Other scaling or conversion factors may also be implemented.

Figure 4:
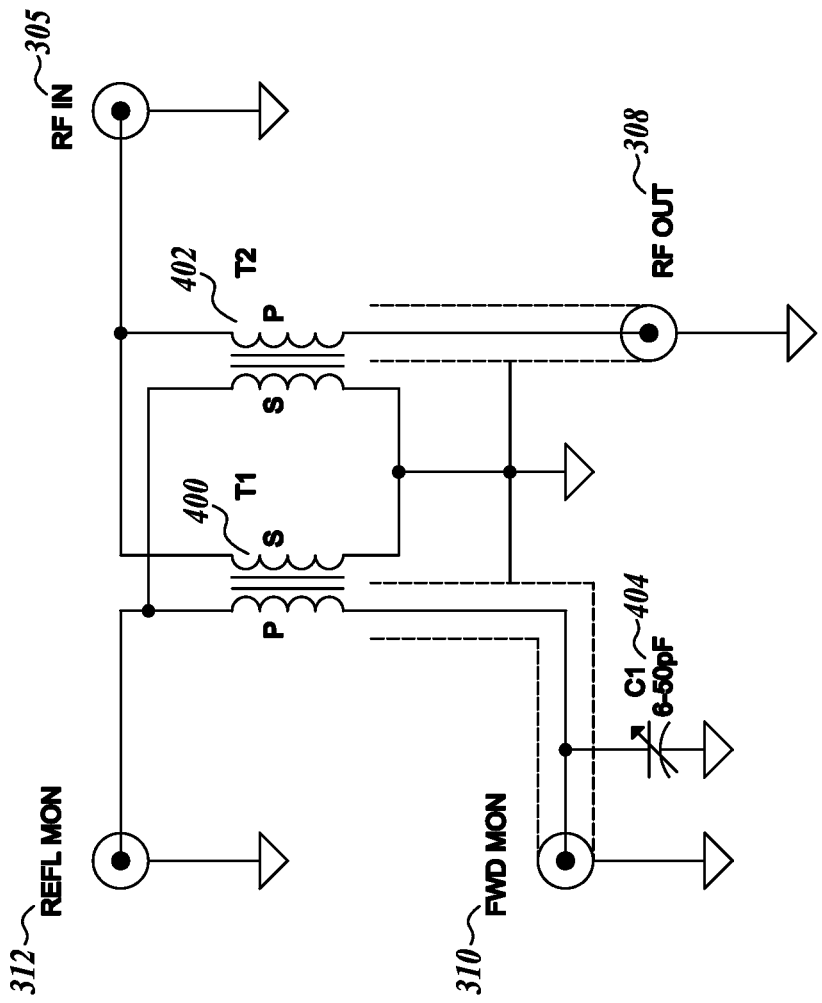
FIG. 4 depicts a circuit diagram of an example of the directional coupler module 306, according to some embodiments.

FIG. 4 depicts a circuit diagram of an example of the directional coupler module 306, according to some embodiments. Directional coupler module 306 may comprise a transformer type of directional coupler. As shown in FIG. 4, the RF signal (labeled RF IN) from the RFPA module 304 may be provided to two branches of the circuit—first branch providing the RF generator output signal 308 and the second branch configured with two transformers 400, 402 to monitor the forward and reflected power as described above. A variable trimmer capacitor 404 may be included in the circuit to improve the accuracy (directivity) of the directional coupler module 306. Capacitor 404 may be configured to have a capacitance between approximately 6 to 50 pico-Farad (pF).

In some embodiments, control module 314 may comprise an analog phase locked loop (PLL) logic circuit using transistor to transistor logic with no microprocessors. Control module 314 may be configured to receive signals 310 and 312 and provide as respective output signals 318 and 320. At least signal 320 (reflected power level indicator), for example, may be used by the stepper motor 108 to dynamically adjust the impedance of the impedance matching module 106. As another example, one or both of the signals 318, 320 may be provided to another control module, processor, compute device, and/or the like for additional functionality. Signal 316 may comprise a set point input signal to turn "on" the RF generator 104. Signal 316 may range between 0 to 10 V.

Figure 5:
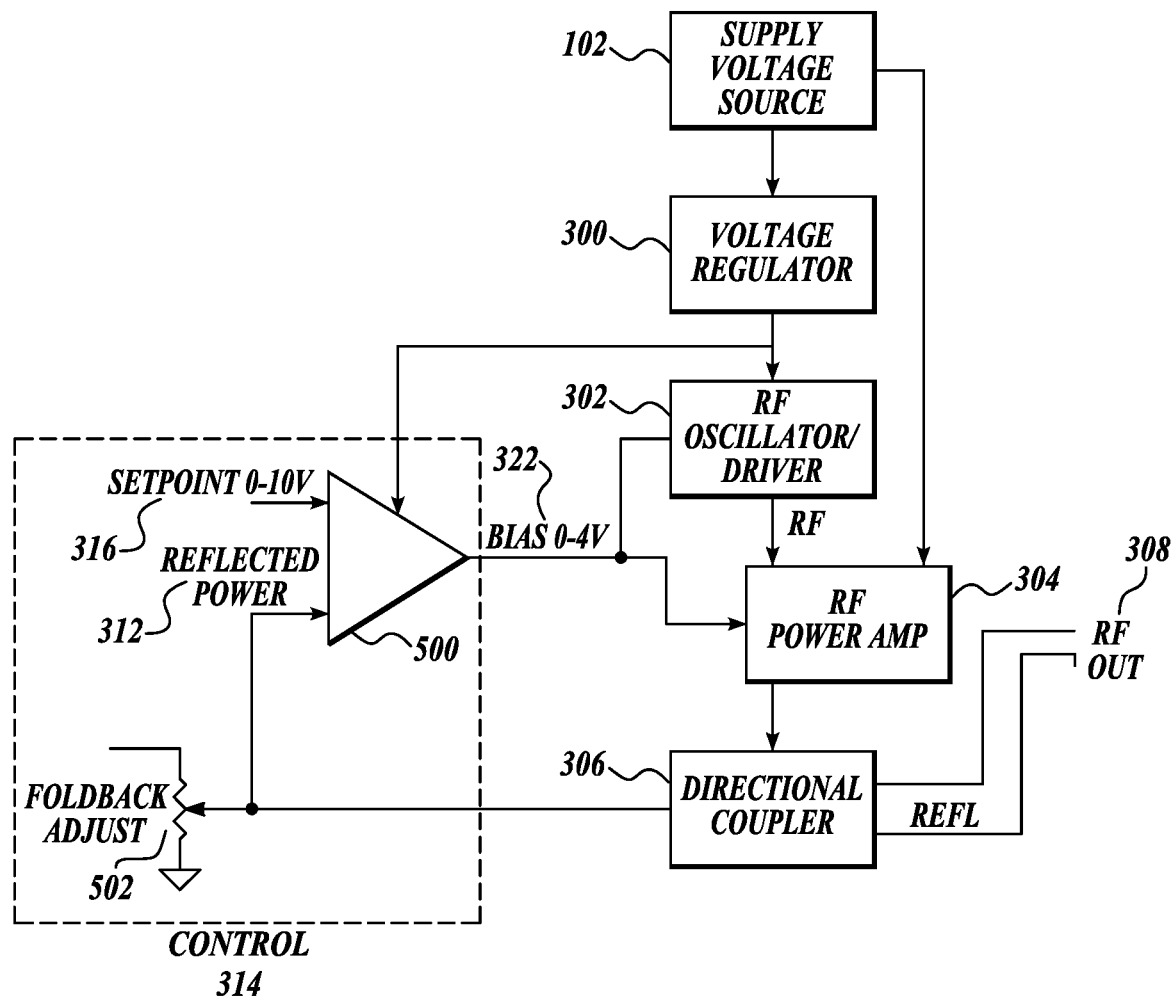
FIG. 5 depicts a block diagram of an example of at least a portion of the system of FIG. 1, according to some embodiments.

Control module 314 may be configured to provide power foldback protection. In some embodiments, control module 314 may include an operational amplifier 500 (as depicted in an example block diagram in FIG. 5) configured to continuously compare the forward and reflected power levels using received signals 310 and 312. If the reflected power level is above a pre-determined threshold (e.g., reflected power level is greater than 15% of the forward power level, reflected power level equals or is greater than a certain voltage), the output of the operational amplifier 500 outputs a bias signal 322 that may be lower than the immediately previous value. With a lower bias applied to the RFPA module 304, the next RF signal 305 generated by the RFPA module 304 is of a proportionately lower power. The next forward power is hence "folded back" or lowered relative to the present forward power. The "folding" back of the forward power may be slowly, gradually, or incrementally implemented rather than shutting off one or more modules and/or the RF generator 104, which may effectively shut off/down system 100 overall. Depending on the rate and/or amount of change of the bias signal 322 over time, the foldback may conform to a shape of a pre-defined power foldback curve.

In some embodiments, a potentiometer 502 (see FIG. 5) included in the control module 314 may be used to define the pre-determined threshold at which foldback may be triggered. For example, potentiometer 502 may be set for the pre-determined threshold to be at when the reflected power reaches 3 V.

The power foldback protection provided by the control module 314 may comprise soft power foldback protection, in which the bias applied to the RPFA module 304 may be reduced one or more times in response to a given foldback trigger condition but the applied bias may not be reduced to zero or no bias. The power associated with the RF signal 305/308 may be folded back merely to a safe level rather than shutting off/down all processing, which may be the case with a hard power foldback. For instance, the power associated with RF signal 305/308 (e.g., the forward power) may be 1250 W at a first point in time, then the reflected power increases to the level where the pre-determined threshold is met. In response, the control module 314 may start reducing the bias signal 322 to the RFPA module 304 one or more times until the reflected power level no longer satisfies the pre-determined threshold (e.g., by falling below the pre-determined threshold). At such time, the power associated with the RF signal 305/308 may at 900 W, as an example.

This feedback control loop implemented in the control module 314 may be considered to be a safety feature that enables protection of transistors (and possibly other components) included in the RF generator 104. For instance, when the reflected power level approaches approximately 10 to 15% of the forward power level, the amount of power dissipation in the transistors may double relative to when the reflected power levels are low. Subjecting transistors (such as the LDMOS transistors included in the RFPA module 304) to too high power dissipation may result in transistor damage, failure, fire, damage or failure to nearby components, and/or the like. In embodiments where the RFPA module 304 may output RF signals greater than 1250 W, such as 2 kiloWatt (kW), power foldback protection may be even more relevant to protect components. Notice that even with the forward power "folded" back, system 100 continues processing the material of interest, albeit at a lower power level than previously. Because of the continuous monitoring and adjustment of the bias signal 322, dynamic control of the RF signal 308 outputted to the impedance matching module 106 may be achieved.

In some embodiments, control module 314 may be configured to include a temperature based protection feature. When a thermistor (or a temperature sensor) included in the RF generator 104 detects a certain temperature associated with the RF generator 104, such as of the heat sink 230, the thermistor may be configured to change its value or state. Such change in the thermistor value or state triggers the control module 314 to communicate a temperature signal 324 to the RFPA module 304 and to reduce the bias signal 322 to 0 V, thereby turning off the RFPA module 304. Thermistor may experience a value or state change when the heat sink 230 gets too hot, one or both of the fans 236, 238 may be non-operational or blocked, or some other internal thermal buildup has reached too high a level. The thermistor, in some embodiments, may comprise an inexpensive component that may be mounted to one of the screws associated with a transistor of the RF generator 104, and which is configured to decrease in voltage as the temperature increases until when the voltage reaches a pre-set value (such as 1.9 V), the thermistor registers a state change.

Although not shown in FIG. 3, various electrical connections into and out of one or more of modules 300, 302, 304, 306, 314 may comprise shielded connections (such as shielded using coaxial cables) and which may be separately grounded. For example, the electrical connections in which bias signal 322, signal 310, signal 312, signal 316, signal 303, signal 305, signal 318, and/or signal 320 may be respectively transmitted may comprise shielded connections with a separate ground. Although modules 300, 302, 304, 306, 314 may comprise circuitry, one or more of the functionalities of modules 300, 302, 304, 306, and/or 314 may alternatively be implemented using firmware, software, other hardware, and/or combinations thereof.

Figure 6:
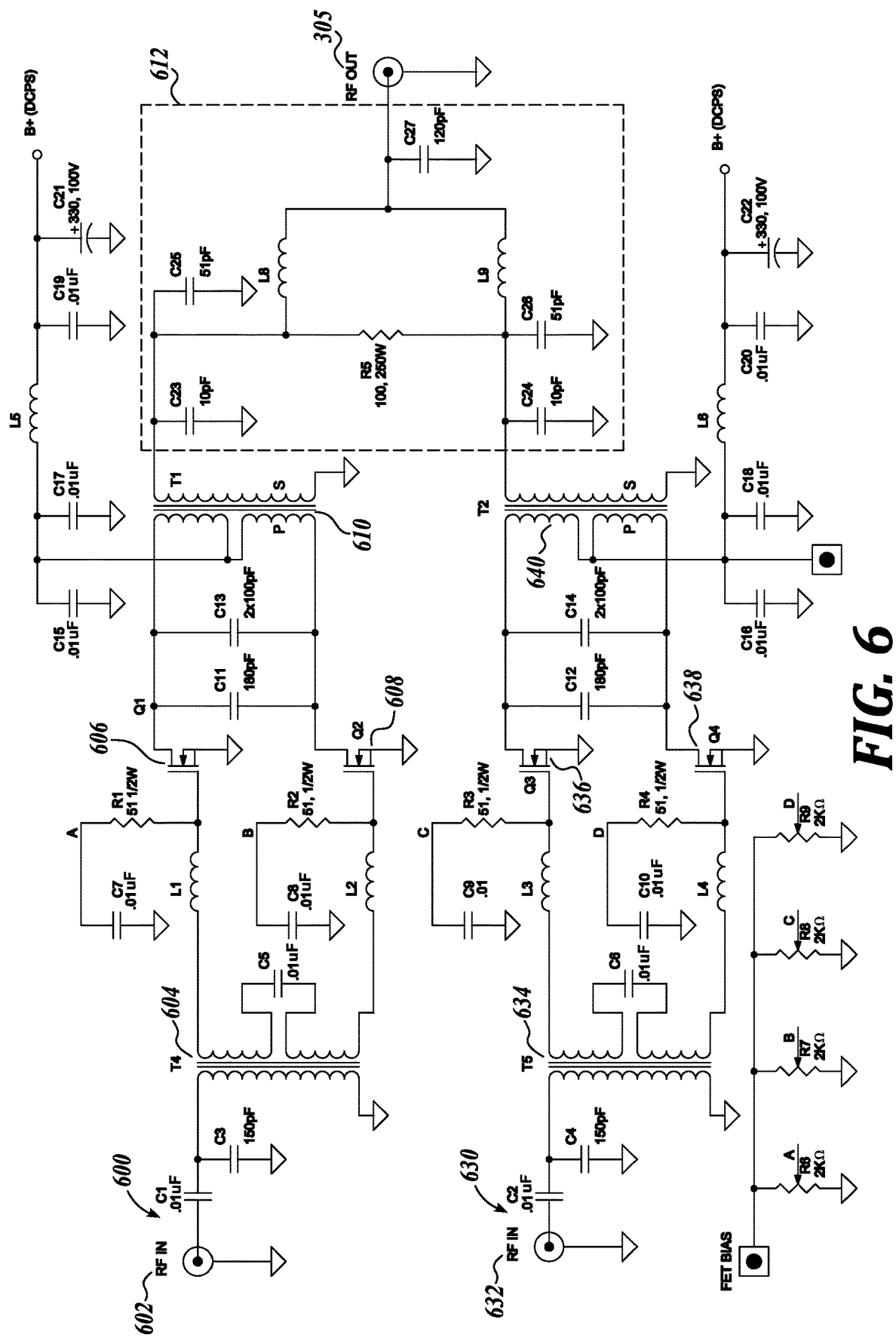
FIG. 6 depicts a circuit diagram of an example of the RFPA module, according to some embodiments.

FIG. 6 depicts a circuit diagram of an example of the RFPA module 304, according to some embodiments. The example circuit diagram may correspond to system 100 operating at 27.12 MHz and a maximum RF power of 1250 W or up to 1400 W depending on ambient air temperature. As shown in FIG. 6, the circuit may comprise first and second branches 600, 630 at the input side (left side of circuit) which are combined together at the output side (right side of circuit), to be described below. The first and second branches 600, 630 may be identical to each other. With the two branch configuration, the LDMOS transistors (transistors 606, 608, 636, 638) included therein may be implemented in a push-pull configuration which provides automatic attenuation, cancellation, or elimination of even order harmonics of the fundamental frequency. Thus, no or very low second, fourth, sixth, and up harmonics may be present.

The circuit shown in FIG. 6 may comprise a plurality of stages or portions. With respect to the first branch 600, going from left to right, may include an input stage, an input transformer stage, a LDMOS transistor stage, an output transformer stage, a signal combiner stage 612, and an output stage. Similarly, the second branch 630, going from left to right, may include an input stage, an input transformer stage, a LDMOS transistor stage, an output transformer stage, the signal combiner stage 612, and an output stage. The signal combiner and output stages are shared in both the first and second branches 600, 630.

In some embodiments, RF signal 303 outputted from the oscillator module 302 may comprise two identically split RF signals 602 and 632. A single RF signal generated by the oscillator module 302 may be split into two identical RF signals using a splitter included in the oscillator module 302 just prior to being outputted to the RFPA module 304. Each of the split RF signals 602, 632 may have half the power of the single RF signal. As an example, each of the split RF signals 602, 632 may have a power of 3 W. Split RF signals 602, 632 may be generated to serve as the driving or input signal for first and second branches 600, 630, respectively. Alternatively, RF signal 303 from the oscillator module 302 may comprise a single signal which may be split upon receipt in the RFPA module 304.

The receipt of split RF signal 602 may occur in the input stage of the first branch 600. Next, an input transformer 604 (with associated circuitry) included in the input transformer stage may be configured to process the split RF signal 602 suitable to be inputs for the LDMOS transistor stage. Input transformer 604 may be configured to further split the split RF signal 602 into a pair of signals, each having a power of 1.5 W. Input transformer 604 may comprise a low power transformer. Input transformer 604 may comprise a variety of types of transformers, including tube transformers with ferrite toroids.

The signals may next comprise the inputs to a pair of LDMOS transistors 606, 608 included in the LDMOS transistor stage of the first branch 600. Each of the LDMOS transistors 606, 608 (with associated circuitry) may be configured to provide power amplify the input signal on the order of approximately 30 dB (e.g., convert a 1.5 W RF signal into a up to 300 W RF signal). LDMOS transistors 606, 608 may comprise electronic components that are inexpensive, reliable, durable, long operational life, and the like in comparison to vacuum tubes. The outputs of the LDMOS transistors 606, 608, now high power RF signals, may then be inputs to an output transformer 610 included in the output transformer stage. The drains of the LDMOS transistors 606, 608 may be electrically coupled to primary windings of the output transformer 610. In some embodiments, output transformer 610 may comprise a tube transformer with powdered iron toroids or non-ferrite based transformer. To avoid degradation of ferrite material in the presence of high power signals, non-ferrite based transformers may be implemented for the output transformer 610. The RF signal at the secondary windings of the output transformer 610 is the input to the signal combiner stage 612.

Second branch 630 may similarly process split RF signal 632 using stages including an output transformer 634, LDMOS transistors 636, 638, and output transformer 640 as discussed above for output transformer 604, LDMOS transistors 606, 608, and output transformer 610, respectively.

In some embodiments, the signal combiner stage 612 may be configured to combine two inputs into a single output. The secondary windings of the output transformer 610 may be electrically coupled to a (shunt) capacitor C23 having a capacitance of 10 pF, which in turn may be electrically coupled to an inductor L8 having an inductance of 0.3 μH, which in turn may be electrically coupled to another (shunt) capacitor C25 having a capacitance of 51 pF. Capacitors C23, inductor L8, and capacitor C25 may comprise one input branch of the signal combiner stage 612. The secondary windings of the output transformer 640 may be electrically coupled to a (shunt) capacitor C24 having a capacitance of 10 pF, which in turn may be electrically coupled to an inductor L9 having an inductance of 0.3 μH, which in turn may be electrically coupled to another (shunt) capacitor C26 having a capacitance of 51 pF. Capacitors C24, inductor L9, and capacitor C26 may comprise another input branch of the signal combiner stage 612. A (shunt) capacitor C27 having a capacitance of 120 pF may be common to both input branches and comprise the output branch of the signal combiner stage 612.

The signal combiner configuration shown in FIG. 6 may comprise a non-conventional Wilkinson combiner configuration. In a conventional Wilkinson combiner, the impedance associated with each of the two input branches is half the impedance associated with the output branch. The reactance that may be required to match two input impedances of 25 Ohm (Ω) to a single 50Ω output impedance is 70Ω for each component. In FIG. 6, the input impedance is not 25Ω, deviating from conventional Wikinson combiners. Instead, in FIG. 6, the reactance associated with inductor L8 may be 50Ω (+j50), the reactance associated with capacitors C23 plus capacitor C25 may be 100Ω (−j100), and reactance associated with inductor L8 (at 0.3 µH) and capacitor C24 plus capacitor C26 may be 100Ω (−j100). In FIG. 6, inductors L5 and L6 may comprise RF chokes and each may be 0.2 µH, and inductors L1-L4 may be 0.1 µH.

The parameter values of at least components included in the signal combiner stage 612 may be selected to facilitate signal waveform shaping and/or Class E operation/generation. The voltage waveform shape at the drains of the LDMOS transistors 606, 608, 638, 640 may have a square (or approximately a square) waveform shape. Class E operation refers to the highest class of power efficiency operation. RF signal 305 may comprise a signal having a 75 to 80% power efficiency in DC to RF conversion, having a DC to RF conversion efficiency greater than 50%, or the like.

Figure 7:
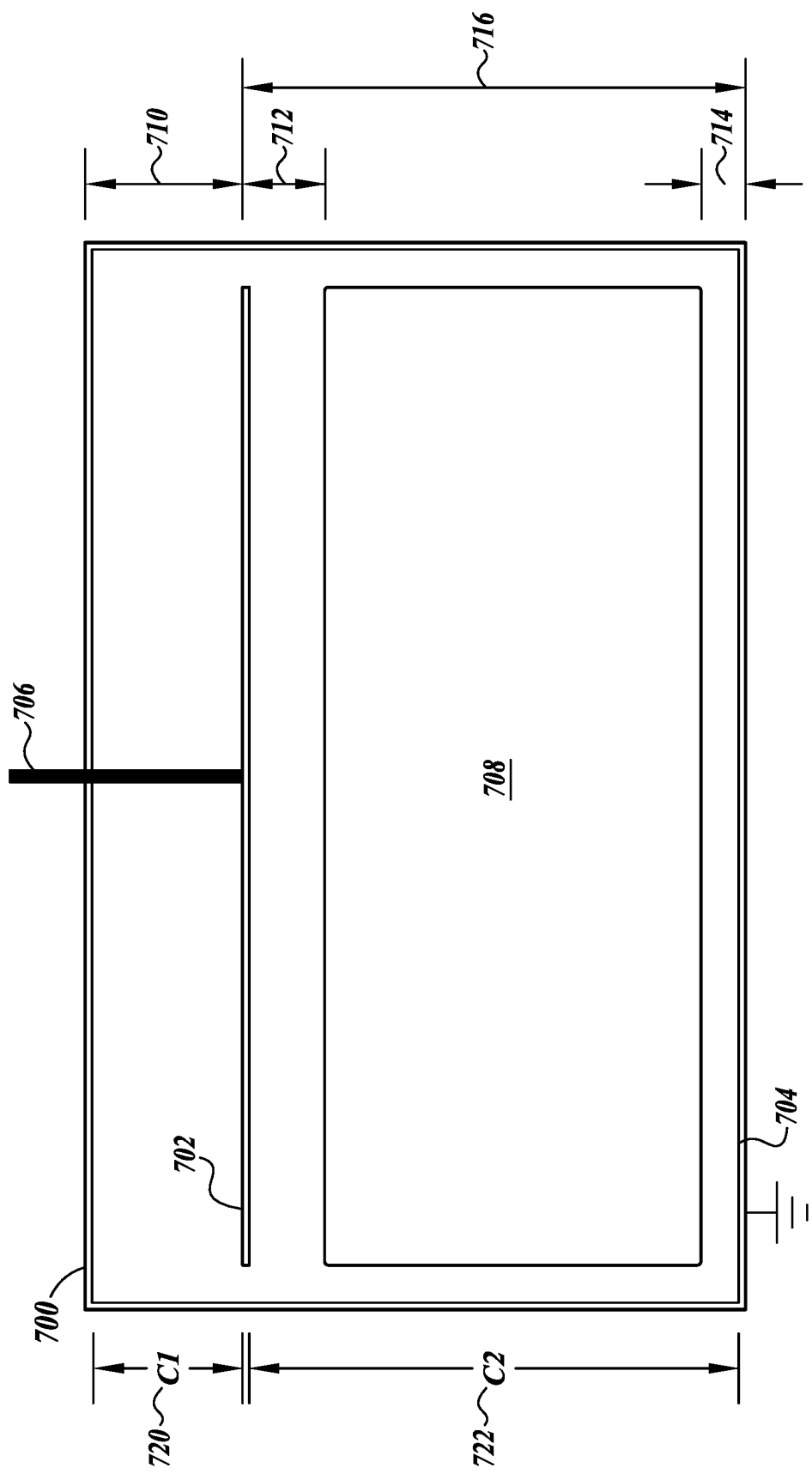
FIG. 7 depicts a cross-sectional view of an example of the cavity, according to some embodiments.

FIG. 7 depicts a cross-sectional view of an example of the cavity 110, according to some embodiments. Cavity 110 may include, without limitation, a housing 700, a first electrode plate 702, a second electrode plate 704, and a RF signal conduit or cable 706. Housing 700 may include an opening through which the RF signal conduit or cable 706 may pass through. One end of the RF signal conduit or cable 706 may be electrically coupled to the output of the impedance matching module 106. The opposite end of the RF signal conduit or cable 706 may electrically couple to first electrode plate 702. RF signal generated by the RF generator 104 (e.g., 27.12 MHz, 1250 W signal) may be transmitted through the RF signal conduit or cable 706 to a material of interest 708 located between the first and second electrode plates 702, 704.

The first electrode plate 702, also referred to as an electrode or top electrode, may be fixedly positioned at a particular location between the top and bottom of the housing 700. A distance or height 710 may separate the top of the housing 700 from the first electrode plate 702, and a distance or height 716 may separate the first electrode plate 702 from the bottom of the housing 700. Second electrode plate 704, also referred to as an electrode, bottom electrode, or ground electrode, may comprise the bottom (or at least a portion of the bottom) of housing 700. Second electrode plate 704 may comprise a grounding plane of the cavity 110. Alternatively, second electrode plate 704 may comprise an electrode plate located above the bottom of housing 700 and grounded to a ground plane of the housing 700.

Each of the housing 700, first electrode plate 702, and second electrode plate 704 may comprise a conductive material, a metal, a metal alloy, stainless steel, aluminum, and/or the like. RF signal conduit or cable 706 may comprise a coaxial cable.

In some embodiments, the length and width of each of the first and second electrode plates 702, 704 may be the same or approximately the same as the length and width of the material of interest 708. Alternatively, the length and/or width of the first and/or second electrode plates 702, 704 may be different (e.g., larger) than that of the material of interest 708. The length and width of at least the first electrode plate 702 may be smaller than the interior length and width of housing 700 so that first electrode plate 702 does not physically contact the sides of the housing 700. For instance, a gap of half an inch may exist between the first electrode plate 702 on all sides of the housing 700.

When material of interest 708 is placed inside the housing 700, material of interest 708 may or may not be in physical contact with one or both of first and second electrode plates 702, 704. In some embodiments, a distance or gap 712 between the first electrode plate 702 and the top of the material of interest 708 may be approximately 0.5 to 1 inches or less, and a distance or gap 714 between the bottom of the material of interest 708 and the second electrode plate 704 may be approximately 0.5 inches or less. In some embodiments, material of interest 708 may have a height of approximately 5 inches and accordingly, distance 716 between first and second electrode plates 702, 704 may be approximately 6 inches. The corresponding housing 700 dimensions may then be approximately 560 millimeter (mm)×430 mm×610 mm. Alternatively, distance 716 may be smaller or larger than 6 inches, as discussed in detail below. Distance 710 (also referred to as a gap) may be selected to reduce changes in total load impedance with changes in dimensions of the material of interest and dielectric constant. The distance 710 may create a swamping capacitor to swamp out changes in capacitance 722. This is due to capacitance 720 (C1) being much larger than capacitance 722 (C2). The increase in total capacitance reduces the load Q (in which Q=reactance/resistance). Lowering the reactance of the load impedance, and thus lowering the Q, facilitate tuning the match impedance. Distance 710 may be 0.5 to 2 inches or less.

A capacitance 720 (also referred to as capacitance C1) may be defined by the top of housing 700 and first electrode plate 702 (e.g., pair of electrodes), the distance 710 between them, and the dielectric properties of the material between the pair of electrodes (e.g., air). Since capacitance is inversely proportional to the distance between the electrodes, as distance 710 decreases, the higher the value of capacitance 720. In some embodiments, the smaller the distance 710, the greater the design flexibility for one or more of the other parameters, dimensions, or the like in system 100. A capacitance 722 (also referred to as capacitance C2) may be defined by the first and second electrode plates 702, 704 (e.g., pair of electrodes), the distance 716 between them, and the dielectric properties of the material between the pair of electrodes (e.g., a combination of air and material of interest 708 (e.g., meat, ice, and salt)). Capacitance 720 is arranged in parallel with capacitance 722.

Figure 8A:
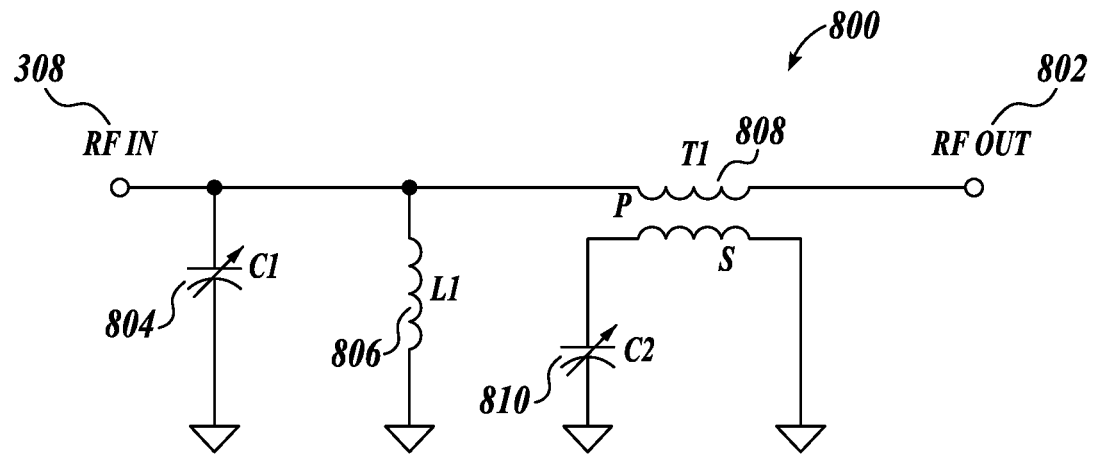
FIG. 8A depicts a circuit diagram of an example of the impedance matching module, according to some embodiments.

FIG. 8A depicts a circuit diagram of an example of the impedance matching module 106, according to some embodiments. Impedance matching circuit 800, also referred to as an LL match circuit, may be configured to include a capacitor 804 (also referred to as C1), an inductor 806 (also referred to as L1), a transformer 808 (also referred to as T1), and a capacitor 810 (also referred to as C2). RF signal 308 outputted by RF generator 104 may comprise the input to circuit 800 at capacitor 804. RF signal 802 outputted by circuit 800 at secondary windings of transformer 808 may be the input to RF signal conduit or cable 706 of cavity 110 (e.g., to the load).

In some embodiments, capacitor 804 and inductor 806 may be arranged in parallel with each other, and such parallel arrangement, in turn, may be in series with the primary windings of transformer 808 which may form what may be referred to overall as a primary circuit. Capacitor 810 and the secondary windings of transformer 808 may form another series circuit, which may also be referred to as a secondary circuit. As the capacitance of capacitor 804 is changed, the overall reactance associated with the primary circuit changes. Due to coupling between the secondary and primary windings of transformer 808, such change in the secondary circuit causes a change in the inductance associated with the primary circuit. Secondary windings of transformer 808 may be considered to change or control the inductance associated with the primary windings of transformer 808. The primary circuit, and the primary windings of transformer 808 in particular, may thus be considered to have variable inductance capabilities.

Capacitor 804 (C1) and capacitor 810 (C2) correspond to respective complex impedance of capacitance 720 (C1) and capacitance 722 (C2) associated with cavity 110. In some embodiments, since capacitance 722 (C2) is associated with the material of interest 708 and the material of interest 708 is the item undergoing thermal change, capacitance 722 (C2) changes over the course of processing time as the material of interest 708 undergoes thermal change. As capacitance 722 (C2) changes over time, so does its associated impedance. In order for the impedance matching module 106 to maintain an impedance match between the RF generator 104 and cavity 110, as the impedance associated with the cavity 110 changes over the course of processing due to at least impedance changes associated with the material of interest 708, capacitance values of capacitor 810 (C2) and/or capacitor 804 (C1) in the impedance matching module 106 may be selectively and/or dynamically adjusted accordingly. Capacitors 804, 810 may also referred to as variable value capacitors or variable capacitance value capacitors.

For example, when the material of interest 708 comprises protein of approximately 5 inches in height, distance 716 between first and second electrode plates 702, 704 of cavity 110 is approximately 6 inches, and the material of interest 708 is to be heated from a start temperature of approximately −20° C. to an end temperature of −3° C.±1° C., capacitor 804 may range between 16 to 107 pF, 16 to 250 pF, or the like; capacitor 810 may range between 16 to 40 pF, 16 to 80 pF, or the like; and inductor 806 may be approximately 74 nanoHenry (nH).

The impedance values associated with circuit 800 overall (also referred to as the match impedance values) for different combinations of minimum and maximum capacitance values of capacitors 804, 810 are provided below.

| Capacitor 804 (C1) | Capacitor 810 (C2) | Match impedance |
|---|---|---|
| 20 pF | 20 pF | 2.0 Ω-j50 |
| 120 pF | 20 pF | 3.0 Ω-j55 |
| 120 pF | 120 pF | 3.5 Ω-j72 |
| 20 pF | 120 pF | 3.0 Ω-j69 |
| 120 pF + a 120 pF capacitor added in parallel with capacitor 804 | 120 pF | 5.0 Ω-j77 |

As can be seen, the real component of the match impedance ranges between 2 to 5Ω and the reactive component of the match impedance ranges between −j50 to −j77. Such range in the match impedance provides sufficient margin to cover possible values of the load impedance (e.g., the impedance associated with the cavity 110 overall) throughout the process. In some embodiments, approximately the center of the match impedance range possible based on the range of capacitors 804, 810 may be selected to be the same as the load impedance values, and the remaining portions of the match impedance range may be selected to provide a margin of error. For instance, load impedance associated with lean beef at −3° C. may be 3Ω −j60, which is well within (and is near the center of) the match impedance range of 2 to 5Ω in real component and −j50 to −j77 in reactive component.

Figure 8B:
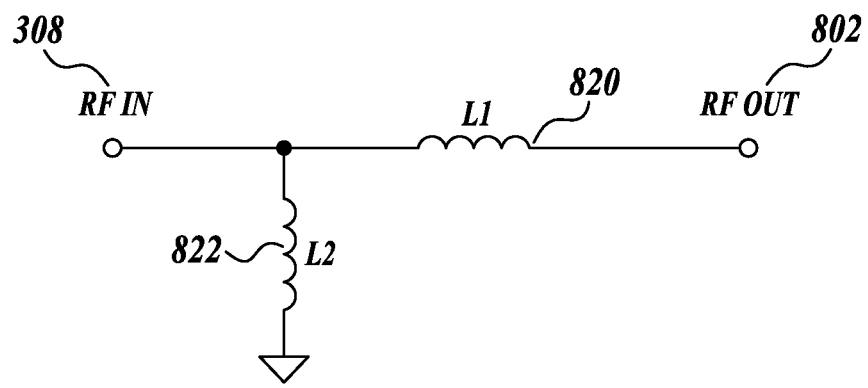
FIG. 8B depicts a circuit diagram showing an example of an equivalent circuit of the variable inductance associated with the circuit of FIG. 8A, according to some embodiments.

FIG. 8B depicts a circuit diagram showing an example of an equivalent circuit of the variable inductance discussed above, according to some embodiments. Also referred to as an LL equivalent circuit, the circuit may comprise an inductor 820, ranging between 0.28 to 0.44 microHenry (μH), in series with an inductor 822, ranging between 54 to 74 nH, for the same processing parameters as discussed immediately above.

Figure 9:
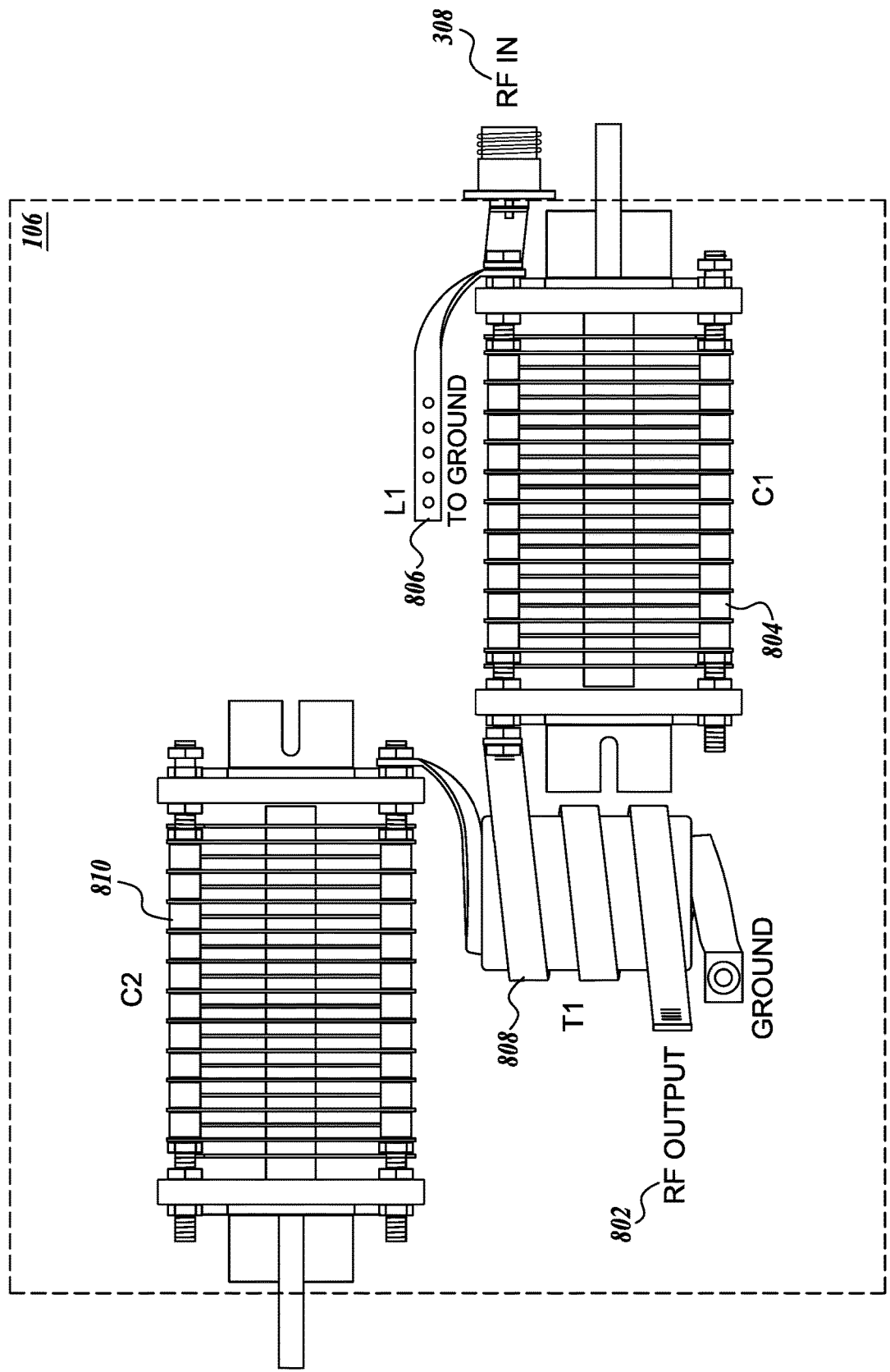
FIG. 9 depicts a top view of an example of electronic components which may be used to implement the circuit of FIG. 8A, according to some embodiments.

FIG. 9 depicts a top view of an example of electronic components which may be used to implement circuit 800, according to some embodiments. Capacitors 804, 810 may comprise multi-plate or multiple plate type of capacitors, in which one or more plates may be mechanically moved to one or more positions to vary the capacitance. Inductor 806 may comprise a strap inductor. In some embodiments, inductor 806 may comprise a flat strip of silver plated copper. The inductance value of the inductor 806 may be set based on the dimensions of the flat strip of silver plated copper, in particular the length. For instance, an inductance of 74 nH may be achieved using a flat strip of silver plated copper having dimensions of 0.06 inch×0.375 inch×6.0 inch. Alternatively, inductor 806 may comprise other types of metals, alloys, or conductive material.

Figure 10B:
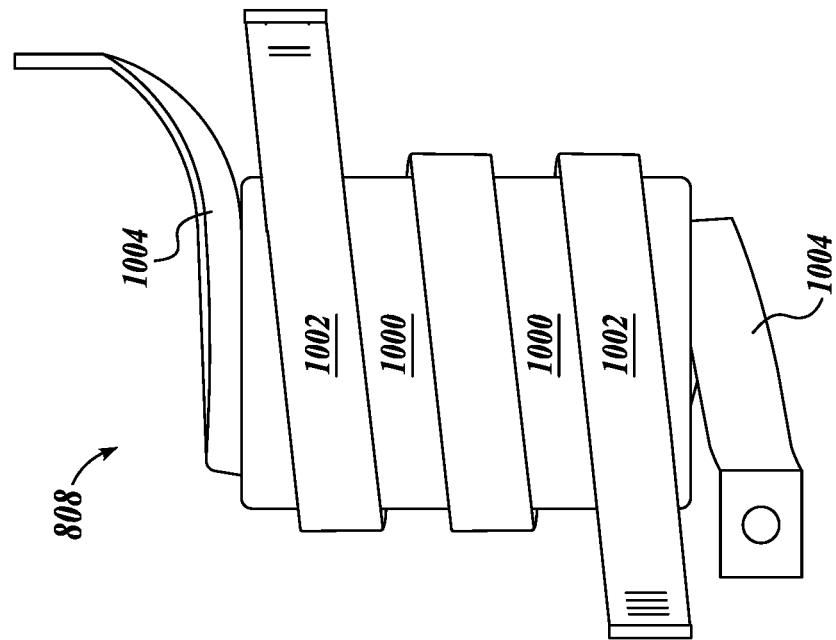
FIGS. 10A-10B depict additional views of an example of the transformer, according to some embodiments.
Figure 10A:
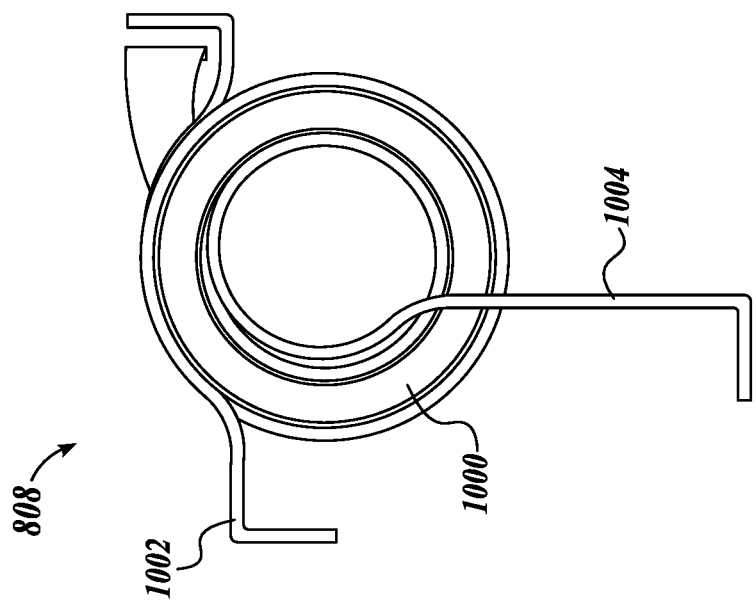

Transformer 808 may comprise an air core type of transformer. Transformer 808 may also be referred to as a flat wound variable inductance transformer. FIGS. 10A-10B depict additional views of an example of the transformer 808, according to some embodiments. As shown in a cross-sectional view in FIG. 10A, transformer 808 may include a tube 1000, a primary coil 1002, and a secondary coil 1004.

Tube 1000 may comprise a hollow cylinder having particular outer and inner diameters and length. In some embodiments, tube 1000 may comprise a non-magnetic, non-conductive, and/or insulative material such as, but not limited to, Teflon or other material. The dimensions and shape of the tube 1000 provide a coefficient of coupling of 0.76. That is, the voltage induced in the secondary windings may be 0.76 times the voltage in the primary windings. Tube 1000 may also be referred to as a hollow cylindrical form or Teflon tube. Primary coil 1002 may comprise a flat conductive strip, comprising silver plated copper, that is wound or wrapped around the outer surface of the tube 1000. Secondary coil 1004 may also comprise a flat conductive strip of silver plated copper (similar material to primary coil 1002) that is wound or wrapped around the inner surface of the tube 1000. Each of the primary and secondary coils 1002, 1004 may be spirally wrapped around the tube 1000 so that it extends the entire length of tube 1000. As shown in FIG. 10B, one end of each of the primary and secondary coils 1002, 1004 may be located at one end of the tube 1000 and the other end of each of the primary and secondary coils 1002, 1004 may be located at the opposite end of the tube 1000.

In some embodiments, tube 1000 may have an inner diameter of approximately 1.25 inch, an outer diameter of approximately 1.5 inch, and a length of 2.2 inch. Primary coil 1002 may be 0.06 inch thick, 0.375 inch wide, and 15.5 inches in length. When wrapped around the tube 1000, the wrapped-around diameter of primary coil 1002 may be similar to that of the outer diameter of tube 1000. Secondary coil 1004 may be 0.06 inch thick, 0.375 inch wide, and 15.5 inches in length. When wrapped around the tube 1000, the wrapped-around diameter of secondary coil 1004 may be similar to that of the inner diameter of tube 1000.

Primary and secondary coils 1002, 1004 may also be referred to as windings, flat strips, thin strips, flat windings, or the like. In alternative embodiments, primary and secondary coils 1002, 1004 may comprise conductive materials, metals, alloys, or the like other than silver plated cooper.

Primary and secondary coils 1002, 1004 may comprise respectively the primary and secondary windings of the transformer 808. In some embodiments, the number of turns or windings of the primary coil 1002 around the outside of the tube 1000 may be three turns, while the number of turns or windings of the secondary coil 1004 around the inside of the tube 1000 may be four turns. While the lengths of the primary and secondary coils 1002, 1004 may be the same as each other, because the inner circumference of tube 1000 has a smaller diameter than the outer circumference of tube 1000, the number of turns around the inner circumference is larger than the number of turns around the outer circumference. The inductance associated with each of the primary and secondary coils 1002, 1004 may be identical to each other. For example, the inductance associated with each of the primary and secondary coils 1002, 1004 may be approximately 0.26-0.28 µH.

In alternative embodiments, transformer 808 may be configured to include an additional turn or winding of each of the primary and secondary coils 1002, 1004 relative to the number of turns discussed above (for a total of four turns for primary coil 1002 and five turns for secondary coil 1004). Tube 1000 may have the following dimensions: an inner diameter of 1.2 inch, an outer diameter of 1.55 inch, and a length of 3 inch. Such configuration may increase the inductance associated with each of the primary and secondary coils 1002, 1004 by approximately 50 nH from the inductances associated with the transformer configuration discussed above (e.g., to now approximately 0.31 µH). This transformer may be larger than the version of transformer 808 discussed above, and may facilitate providing impedance matching of cavity 110 configured with electrode distance 716 in the range of approximately 4.5 inches up to 12.5 inches. For this configuration, the capacitance values of the capacitor 810 (C2) may also be reduced relative to the values discussed above. For example, capacitor 810 (C2) may have a capacitance range of approximately 16-80 pF. Impedance matching module 106 may further include a 1:1 gear pulley mechanism configured to move the plates/fins of the capacitors 804, 810 together. The gear pulley mechanism may be actuated by a single stepper motor.

Figure 11:
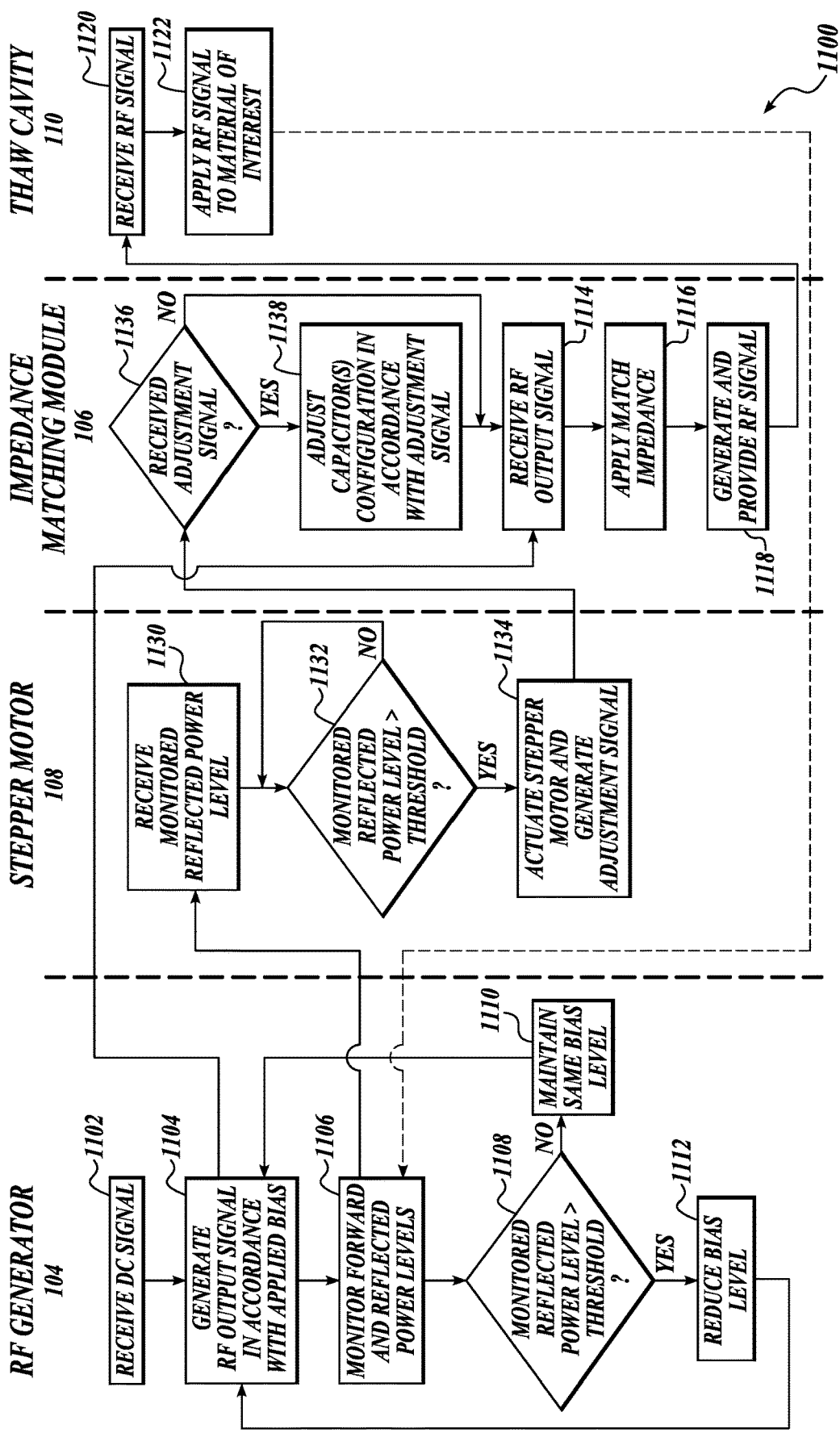
FIG. 11 depicts an example process that may be performed by the system of FIG. 1, according to some embodiments.

FIG. 11 depicts an example process 1100 that may be performed by the system 100 to thermally process the material of interest 708 to the end temperature, according to some embodiments. At block 1102, RF generator 104 may be configured to receive the DC signal generated by the DC power source 102. Using the received DC signal and in accordance with the bias level applied to the RFPA module 304 by the control module 314, RF generator 104 may be configured to generate a RF output signal (e.g., RF output signal 308) in accordance with the applied bias, at block 1104.

Simultaneously, at block 1106, directional coupler module 306 included in the RF generator 104 may be configured to monitor or detect forward and reflected power levels of the system 100. Block 1106 may be performed continuously in some embodiments. Alternatively, block 1106 may be performed periodically, randomly, at pre-determined times, and/or at some other time basis. The monitored forward and reflected power levels (e.g., signals 310, 312) may be provided to the control module 314, and the control module 314, in turn, may provide output signals 318 and 320. Signals 318, 320 may also be referred to as monitored outputs that may be available for use by other components. In some embodiments, stepper motor 108 may be coupled to at least the connector associated with signal 320—the monitored reflected power level indication signal. Thus, at block 1130, the reflected power level monitored at block 1106 may be received by the stepper motor 108 at block 1130.

Returning to block 1106, with knowledge of the current forward and reflected power levels, control module 314 included in the RF generator 104 may be configured to determine whether the reflected power level exceeds a threshold, at a block 1108. If the threshold is not exceeded (e.g., the reflected power level is within acceptable limits) (no branch of block 1108), then the current bias level of bias signal 322 to the RFPA module 304 may be maintained and unchanged, at block 1110. Process 1100 may then return to block 1104.

Otherwise, the threshold is exceeded (yes branch of block 1108), and the bias level of bias signal 322 may be reduced by the control module 314, at block 1112. In some embodiments, the reduction of the bias level may be by a pre-set amount, an amount in proportion to the amount of excessive level of the reflected power level, an amount in accordance with a pre-determined foldback curve, and/or the like. Process 1100 may then return to block 1104.

Upon receipt of the monitored reflected power level at block 1130, a control chip, control logic, controller, or the like included in stepper motor 108 may be configured to determine whether the monitored reflected power level exceeds a pre-determined threshold, at block 1132. If the threshold is not exceeded (no branch of block 1132), the process 1100 may return to block 1132 to continue detection of a too high reflected power level in the continuous stream of monitored reflected power levels received at block 1130. If the threshold is exceeded (yes branch of block 1132), then process 1100 may proceed to block 1134 in which changing one or both of capacitors' 804, 810 capacitance values may be initiated.

In some embodiments, the reflected power level may increase as the amount of mismatch between the match impedance value associated with the impedance matching module 106 and the load impedance value associated with the cavity 110 and the material of interest 708 contained therein increases. When the match and load impedances are perfectly matched, the reflected power level may be at zero. Hence, the reflected power level may be used to determine the presence of an impedance mismatch, the extent of the impedance mismatch, and/or serve as a trigger to tune (or re-tune) one or both of the capacitors 804, 810 in the impedance matching module 106. As an example, the threshold at which the reflected power level may be deemed to be too high may be at 2.0 V. Reflected power levels greater than 2.0 V may cause actuation of the stepper motor. The threshold associated with block 1132 may be smaller than the threshold associated with foldback protection at block 1108 by at least a 0.5 V amount. The reflected power levels at which foldback may be warranted tend to be significantly higher than the levels of the reflected power indicative of an impedance mismatch sufficient to trigger a change in the match impedance.

At block 1134, the control chip, control logic, controller, or the like included in stepper motor 108 may be configured to actuate the stepper motor by generating and providing an appropriate adjustment signal to the mechanism configured to mechanically move/adjust the plate(s) of one or both of the capacitors 804, 810.

At the impedance matching module 106, when no adjustment signal may exist (no branch of block 1136), then the capacitance values remain unchanged and process 1100 may proceed to block 1114. Conversely, when an adjustment signal is generated by the stepper motor 108 (yes branch of block 1136), then one or both of the capacitors 804, 810 may undergo mechanical movement or change in configuration to change/adjust/tune the capacitance in accordance with the adjustment signal, at block 1138. In some embodiments, capacitors 804, 810 may be initially configured to be at the highest value within its respective capacitance ranges. As processing commences, the stepper motor 108 may be configured to mechanically move or adjust the capacitors 804, 810 by a pre-set increment amount or "step" down an area associated with the electrodes so that the associated capacitance values decrease. Stepper motor 108 may have, for example, one hundred steps or incremental movement/adjustment capabilities, which may correspond to the full capacitance ranges associated with capacitors 804, 810 (e.g., 16 to 107 pF). An adjustment signal may direct the stepper motor to move by one step or increment, which may correspond to a small change in the capacitance such as approximately 3 to 5 pF. With the capacitance now changed by approximately 3 to 5 pF, the reflected power level in response to such change may be detected in block 1132 (in the next round of reflected power level detection). In some embodiments, stepper motor 108 may comprise more than one stepper motor and/or have the capability to adjust capacitors 804, 810 independent of each other.

If the reflected power level still exceeds the threshold (yes branch of block 1132), then another adjustment signal may be generated in block 1134 to mechanically adjust capacitors 804, 810 by one step or increment and the capacitance value again changes by approximately 3 to 5 pF. This loop may be repeated as necessary until the reflected power level is below the threshold. If the reflected power level once again exceeds the threshold, then single step incremental adjustments to the capacitance may once again occur. Over the course of thermally processing the material of interest 708 to the end temperature, capacitors 804 and/or 810 may move through their full capacitance range, from their highest to lowest capacitance values.

In some embodiments, one or both of the capacitors 804, 810 may be adjusted in response to an adjustment signal, adjustment of capacitors 804, 810 may alternate in response to successive adjustment signals, or the like. For example, capacitors 804 and 810 may both move or be adjusted per stepper motor actuation.

Alternatively, block 1132 may comprise detection of an increase in the reflected power level relative to the immediately preceding detected reflected power level or a certain number of the previously detected reflected power levels. Similar to the discussion above, if an increase is detected, then process 1100 may proceed to block 1134 to cause a step up in capacitance in the impedance matching module 106.

With the capacitance tuned (or more closely tune) to provide a matching impedance, the RF signal 308 generated by the RF generator 104 in block 1104 may be received by the impedance matching module 106 in block 1114. Next at block 1116, the received RF signal 308 may propagate through or be processed by the current configuration of the impedance matching module 106 (including any capacitor(s) which may have been tuned in block 1138). The resulting RF signal 802 generated by the impedance matching module 106 may be provided to the cavity 110 at block 1118.

Upon receipt of the RF signal 802 by the cavity 110, at block 1120, the cavity may be configured to apply the received RF signal 802 to the material of interest 708, at block 1122.

Because system 100 may be configured to continuously monitor the forward and reflected power levels (at block 1106), it may be considered that application of a RF signal to the material of interest at a given point in time may result in the next reflected power being generated, which may be detected in block 1106. This feedback loop may be denoted by the dotted line from block 1122 to block 1106.

In some embodiments, at the end of such continuous processing of the material of interest 708, the temperature uniformity throughout the material of interest's volume may be within ±1.4° C., within 1° C., within less than 1.5° C., or the like. Such temperature uniformity may also exist in the material of interest 708 during the course of the process.

Figure 12A:
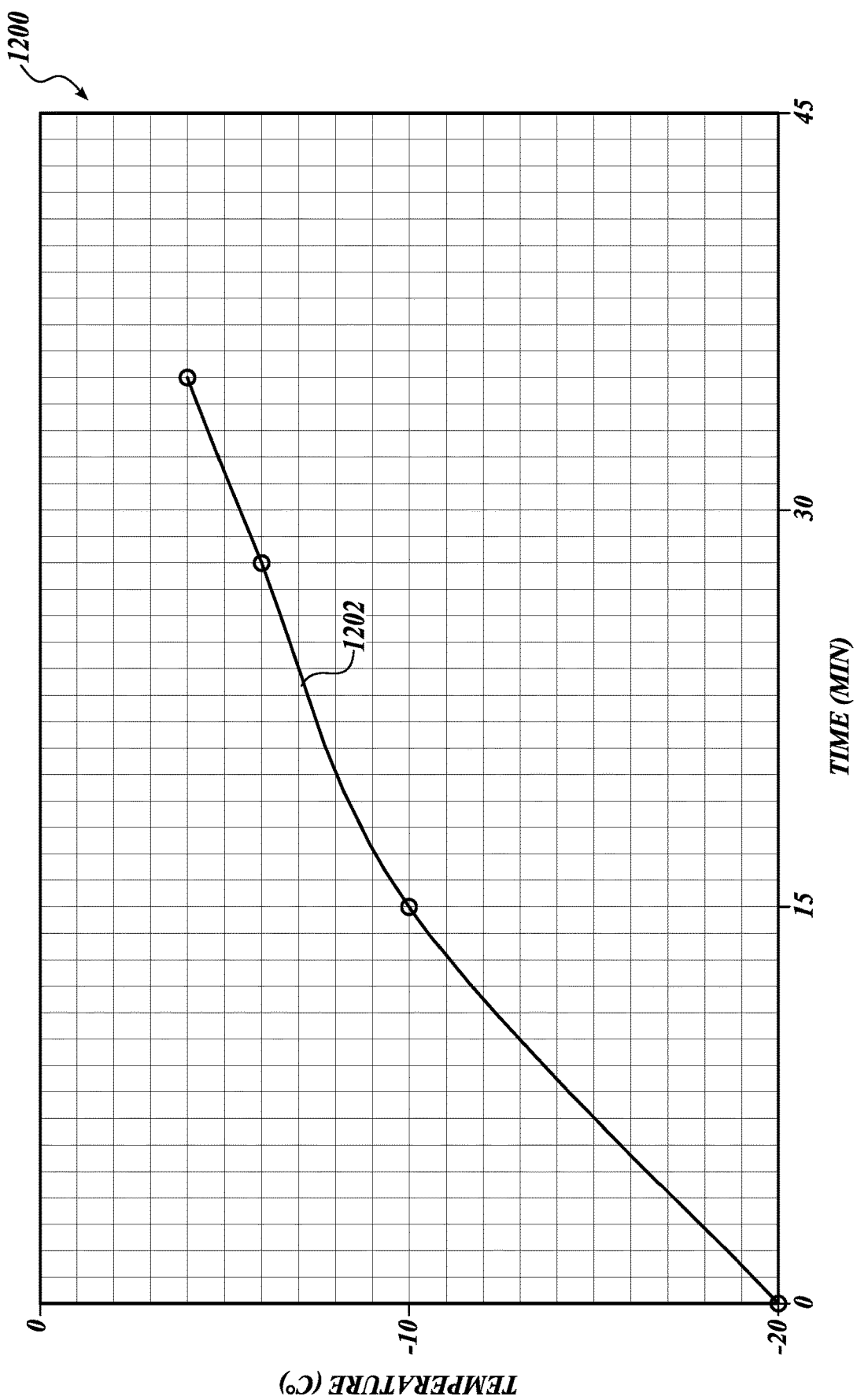
FIG. 12A depicts a graph showing temperatures of a material of interest over the time period of an example process performed by the system of FIG. 1, according to some embodiments.

FIG. 12A depicts a graph 1200 showing temperatures of the material of interest 708 over the time period of an example process performed by the system 100, according to some embodiments. A line 1202 shows the temperatures of the material of interest 708 from a start temperature of −20° C. at a start time to an end temperature of −4° C. at about 35 to 40 minutes as RF energy is continuously applied to the material of interest 708 throughout the 40 minute time period. Notice that the time associated with raising the temperature of the material of interest 708 from −10° C. to −4° C. (the latter part of the temperature range) is more than the time associated with the raising the temperature in the initial part of the process.

Time period for processing a material of interest from less than −20° C. (such as −40° C.) to −3° C.±1° C. may be approximately 40 to 50 minutes or less than an hour. Because the temperature change is rapid at temperatures well below about −10° C., a start temperature less than −20° C. does not add much to the overall processing time then for a start temperature at −20° C.

Figure 12B:
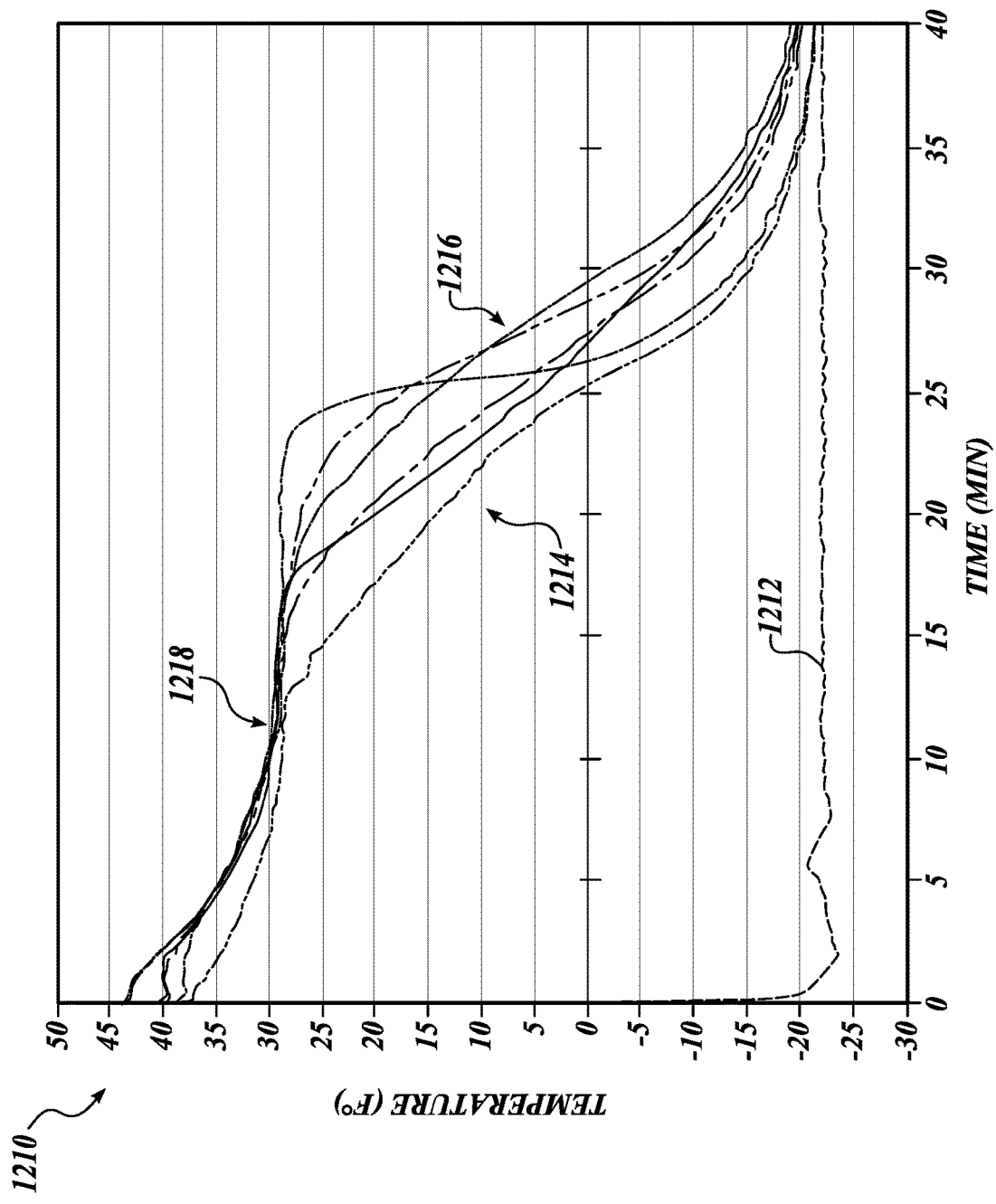
FIG. 12B depicts a graph showing example freeze curves, according to some embodiments.

FIG. 12B depicts a graph 1210 showing example curves 1212 and 1214, according to some embodiments. Curve 1212 may be associated with air, while curves 1214 may be associated with various materials. Although curves 1212 and 1214 may be associated with freezing materials or air, materials in the presence of uniform heat flux (e.g., materials are being heated) may exhibit similar temperature change profiles, except in reverse as a function of time. As shown by section 1216 of the curves 1214, materials may exhibit nearly linear change in temperature as function of time when heating from approximately −20° F. to about 27° F. Materials may also exhibit a time period during which they may not change temperatures even though energy is being applied or extracted, as shown in a horizontal (or nearly horizontal) section 1218 of curves 1214. This section may be referred to as the latent zone. The lack of temperature change in section 1218 may be associated with the materials undergoing phase change from a liquid to solid (e.g., water in the materials turning to ice).

Figure 13:
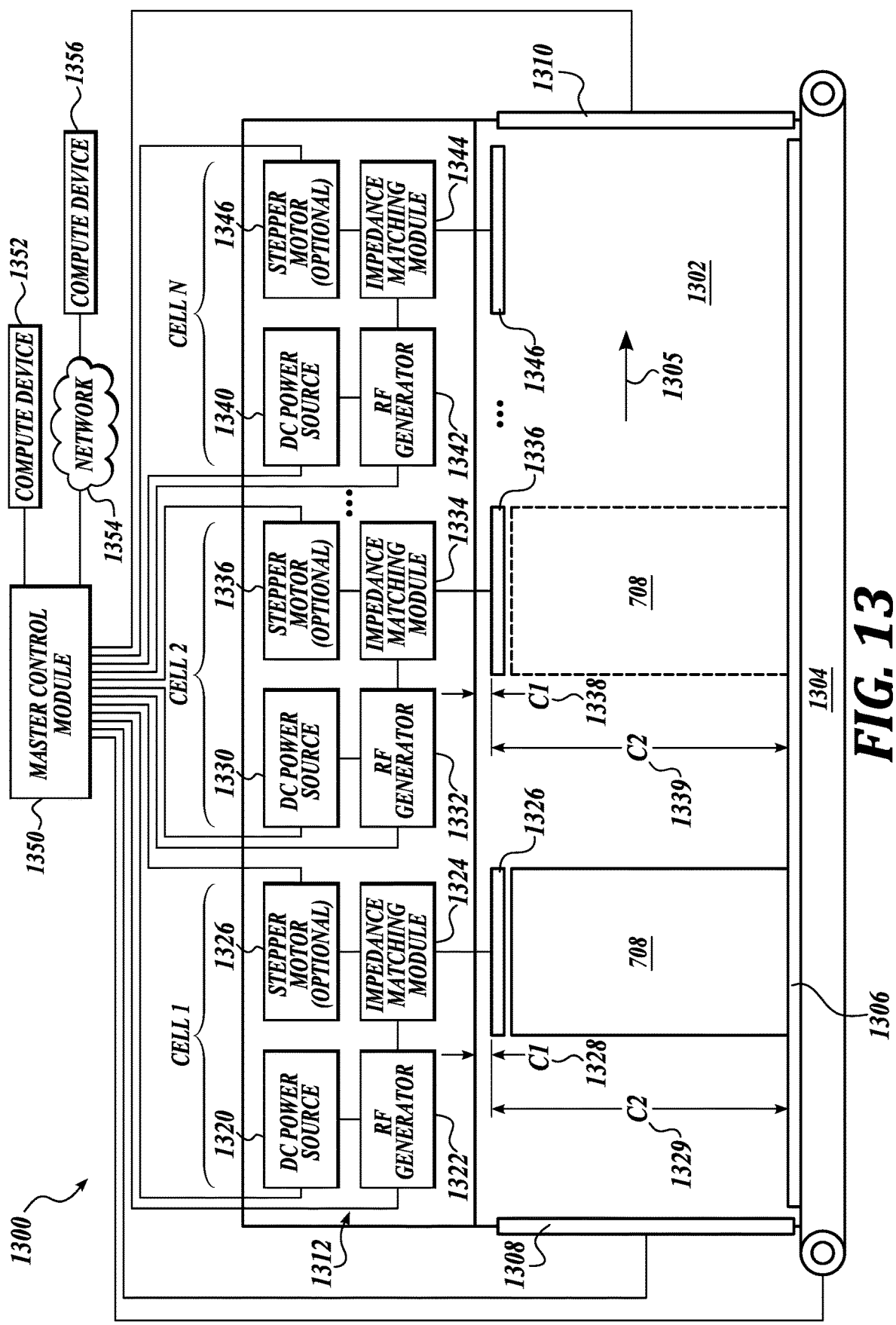
FIG. 13 depicts a block diagram of an example RF processing system incorporating aspects of the present disclosure, according to additional embodiments.

FIG. 13 depicts a block diagram of an example RF processing system 1300 incorporating aspects of the present disclosure, according to additional embodiments. System 100 may comprise a stationary RF processing system, in that the material of interest (e.g., the load) does not move within the system 100 during the applied process, while system 1300 may comprise a RF processing system in which the material of interest moves and/or is repositioned at one or more areas within the system 1300 during the process, as described in detail below.

In some embodiments, system 1300 may include, without limitation, a tunnel 1302, a conveyor 1304, a ground electrode plate 1306, an infeed door 1308, an outfeed door 1310, a plurality of processing cells 1312, a master control module 1350, a compute device 1352, and a compute device 1356. Tunnel 1302 and the compartment(s)/chamber(s) including the plurality of processing cells 1312 are shown in cross-sectional view in FIG. 13.

Tunnel 1302 in combination with the infeed and outfeed doors 1308, 1310 may comprise an enclosure in which the material of interest 708 may be thermally processed. Tunnel 1302 may have a variety of shapes such as, but not limited to, a square tube, a rectangular tube, or the like. Tunnel 1302 may also be referred to as cavity, housing, enclosure, or the like. Tunnel 1302 may be analogous to the cavity 110 for the system 1300.

The bottom of the tunnel 1302 may include a conveyor 1304 that extends at least the length of the tunnel 1302 or extends the length of the tunnel 1302 and also further out than the tunnel 1302 on one or both ends of the tunnel 1302. Conveyor 1304 may include belts, rollers, or other transport mechanisms to cause items placed thereon (e.g., material of interest 708) to move or be transported in a direction 1305. The movement in the direction 1305 may be continuous, intermittent, at constant speed, at variable speed, indexed, on command, and/or the like. Disposed above the conveyor 1304 may be the ground electrode plate 1306. Ground electrode plate 1306 may comprise a conductive material that is electrically grounded. Ground electrode plate 1306 may also be referred to as a ground plate, a ground electrode, or the like. Tunnel 1302 may include the infeed door 1308 at one opening/end and the outfeed door 1310 at the opposite opening/end. Infeed door 1308 may comprise a door or opening through which the material of interest 708 may enter the tunnel 1302. Outfeed door 1310 may comprise a door or opening through which the material of interest 708 may exit the tunnel 1302. In alternative embodiments, one or both of doors 1308, 1310 may be omitted in system 1300.

In some embodiments, the plurality of processing cells 1312 may be located above the tunnel 1302. The plurality of processing cells 1312 (with the exception of the electrode plates 1326, 1336, 1346) may be located in a different chamber or compartment from the tunnel 1302. One or more of the processing cells of the plurality of processing cells 1312 may be located in a different chamber or component from each other.

The plurality of processing cells 1312 may comprise N cells, in which each ith cell of the plurality of processing cells 1312 may include a DC power source, a RF generator, an impedance matching module, a stepper motor, and an electrode plate. The DC power source may be similar to DC power source 102, RF generator may be similar to RF generator 104, impedance matching module may be similar to impedance matching module 106, stepper motor may be similar to stepper motor 108, and the electrode plate may be similar to electrode plate 702.

For instance, as shown in FIG. 13, cell 1 may include a DC power source 1320, a RF generator 1322, an impedance matching module 1324, a stepper motor 1326, and an electrode plate 1326. The RF generator 1322 may be electrically coupled between the DC power source 1320 and impedance matching module 1324, the output of the impedance matching module 1324 may be electrically coupled to the electrode plate 1326, and the stepper motor 1326 may be electrically coupled to the impedance matching module 1324. Cell 2 may include a DC power source 1330, a RF generator 1332, an impedance matching module 1334, a stepper motor 1336, and an electrode plate 1336. The RF generator 1332 may be electrically coupled between the DC power source 1330 and impedance matching module 1334, the output of the impedance matching module 1334 may be electrically coupled to the electrode plate 1336, and the stepper motor 1336 may be electrically coupled to the impedance matching module 1334. Cell N may include a DC power source 1340, a RF generator 1342, an impedance matching module 1344, a stepper motor 1346, and an electrode plate 1346. The RF generator 1342 may be electrically coupled between the DC power source 1340 and impedance matching module 1344, the output of the impedance matching module 1344 may be electrically coupled to the electrode plate 1346, and the stepper motor 1346 may be electrically coupled to the impedance matching module 1344.

In some embodiments, a physical separation or gap may exist between adjacent cells, or between at least the electrode plates 1326, 1336, 1346, of the plurality of processing cells 1312 along direction 1305. The physical separation or gap may be at least a couple of inches to ensure electrical isolation between adjacent cells. The electrode plates 1326, 1336, 1346 may be disposed or positioned a particular distance/gap from the top of the tunnel 1302, similar to distance 710 in cavity 110. The particular distance/gap above the electrode plates 1326, 1336, 1346 (along with the electrode area and dielectric characteristics between the electrodes) may be associated with a capacitance C1—such as capacitances 1328 and 1338 for respective electrode plates 1326 and 1336—which may be similar to capacitance 720 (C1) in cavity 110. Likewise, electrode plates 1326, 1336, 1346 may be disposed or positioned a particular distance/gap from the ground electrode plate 1306, similar to distance 722 in cavity 110. The particular distance/gap between electrode plates 1326, 1336, 1346 and ground electrode plate 1306 (along with the electrode area and dielectric characteristics between the electrodes) may be associated with a capacitance C2—such as capacitances 1329 and 1339 for respective electrode plates 1326 and 1336—which may be similar to capacitance 722 (C2) in cavity 110.

In some embodiments, the components included in each processing cell of the plurality of processing cells 1312 may be identical to each other except for the capacitance range of the capacitors included in the impedance matching module in the respective processing cells. The capacitors included in the impedance matching modules (e.g., impedance matching modules 1324, 1334, 1344) of the plurality of processing cells 1312 may comprise capacitors 804, 810 as shown in FIG. 8A. The capacitance range in respective processing cells may differ from each other.

In some embodiments, each cell of the plurality of processing cells 1312 may be associated with a particular range of temperatures between the start temperature and the end temperature, in which each cell may be associated with a range of temperatures different from each other. The capacitance range in respective processing cells may likewise be selected in accordance with the expected particular temperature range of the material of interest 708 at the respective cells. The start temperature may comprise the temperature of the material of interest 708 at which processing at the first cell (cell 1) starts. The start temperature may also be referred to as the infeed temperature. The end temperature may comprise the temperature of the material of interest 708 after processing at the last cell (cell N) has been completed. The end temperature may also be referred to as the outfeed temperature.

In contrast to system 100, which processes the material of interest 708 at a start temperature to an end temperature using the same DC power source 102, RF generator 104, impedance matching module 106, stepper motor 108, and electrode plates 702, 704, system 1300 may be configured to process the material of interest 708 from the start temperature to the end temperature in stages using the plurality of processing cells 1312. The material of interest 708 may successively advance from cell 1 to cell N, each ith cell configured to change the temperature of the material of interest 708 from an ith start temperature to an ith end temperature higher than the ith start temperature.

For example, the plurality of processing cells 1312 may comprise eight cells (N=8) and the material of interest 708 is to be processed from a start temperature of −20° C. to an end temperature of −2° C. The range of temperatures associated with each cell may be approximately the difference between the start and end temperatures divided by the number of cells. For eight cells, each cell may be configured to process a temperature range of approximately 2.25° C. (=18° C./8). Cell 1 may be configured to process the material of interest 708 from −20° C. to −17.75° C., cell 2 may be configured to process the material of interest 708 from −17.75° C. to 15.5° C., and so forth to cell N which may be configured to process the material of interest 708 from −4.25° C. to −2° C. In some embodiments, the temperature range of respective cells may or may not be identical to each other. Certain one or more of the cells may be associated with a wider or narrower temperature range than the remaining cells. For instance, cell 1 and cell N may be configured to handle a 3 or 4° C. temperature range while the remaining cells may be configured for a less than 2° C. temperature range. It is understood that although eight cells are discussed above, the number of cells may be less or greater than eight cells such as, but not limited to, two, four, five, six, 10, 12 cells or the like.

In some embodiments, the capacitance range associated with the impedance matching module of each cell may be a sub-range of values of the full capacitance range if the material of interest 708 was processed in a stationary system such as system 100. The sub-range of values of the full capacitance range associated with each cell may be different from each other. The capacitors in the impedance matching module (e.g., capacitors 804, 810 as in FIG. 8A) of each cell may be tunable between the lowest to highest value of its associated assigned sub-range of values. When the capacitors have tuned through the sub-range but the measured reflected power level for the cell is still above a threshold, then the material of interest may be at a temperature outside the temperature range assigned for that cell and the material of interest is to be advanced to the next cell, as described in detail below.

In alternative embodiments, the capacitors included in the impedance matching modules may comprise fixed value capacitors (also referred to as fixed capacitance value capacitors) that do not change during processing of the material of interest. Stepper motors (e.g., stepper motors 1326, 1336, 1346) may be optional in system 1300 if fixed capacitance is implemented in the cells. Each of the impedance matching modules 1324, 1334, 1346 may include the circuit 800 except capacitors 804 (C1) and 810 (C2) may either be set to particular values or may be replaced with fixed capacitors at the particular values. An example of fixed capacitance values of C1 and C2 in the impedance matching modules in a eight cell configuration, for a −20° C. to −2.5° C. process, with an approximately 6 inch distance between electrode plates 1326, 1336, 1346 and ground electrode plate 1306, and in which the material of interest 708 may comprise protein is provided below.

| Cell | Incoming Temperature (° C.) | Processing time at cell (minutes) | RF power (W) | Match impedance (ohm) | C1 (pF) | C2 (pF) |
|---|---|---|---|---|---|---|
| 1 | −20.0 | 5 | 1000 | 2.50-j63.0 | 100 | 60 |
| 2 | −17.5 | 5 | 1000 | 2.57-j62.57 | 90 | 57 |
| 3 | −15.0 | 5 | 1000 | 2.64-j62.14 | 80 | 54 |
| 4 | −12.5 | 5 | 1000 | 2.71-j61.71 | 70 | 51 |
| 5 | −10.0 | 5 | 1100 | 2.78-j60.28 | 60 | 48 |
| 6 | −7.5 | 5 | 1200 | 2.85-j60.85 | 50 | 45 |
| 7 | −5.0 | 5 | 1300 | 2.92-j60.42 | 40 | 42 |
| 8 | −2.5 | 5 | 1300 | 2.99-j59.99 | 30 | 39 |

In the table above, an example of RF power which may be increased in the later cells relative to the starting cells is also shown. Such power increase may be implemented to speed up the processing time in those cells.

In still other embodiments, the plurality of processing cells 1312 may be implemented using a mix of variable capacitor cells and fixed capacitor cells. The fewer the number of cells comprising the plurality of processing cells 1312, the greater the number of cells may be configured with variable capacitors. The fewer the number of cells comprising the plurality of processing cells 1312, the more likely the cells may be configured as variable capacitor cells in order to maintain impedance match in each cell.

In some embodiments, total time to bring the material of interest 708 to the final end temperature (e.g., −2° C.±1° C.) may be approximately the same in both systems 100 and 1300. In system 1300, the amount of time that the material of interest 708 may spend electrically coupled to a particular cell may be approximately the total processing time divided by the number of cells. For example, for start and end temperatures of −20° C. and −2° C., respectively, the amount of processing time at a given cell may be approximately 4-5 minutes before the material of interest 708 is advanced to the next cell.

In some embodiments, master control module 1350 may be configured to control components and coordinate operation of components during processing of the material of interest 708. Master control module 1350, also referred to as a master controller, main controller, or the like, may comprise one or more programmable logic controller (PLC), microprocessor, processor, computer, work station, laptop, server, and/or the like. Master control module 1350 may be electrically coupled to and/or be in communication with, without limitation, the conveyor 1304, infeed door 1308, outfeed door 1310, DC power sources (e.g., DC power sources 1320, 1330, 1340), RF generators (e.g., RF generators 1322, 1332, 1342), stepper motors (e.g., stepper motors 1326, 1336, 1346), compute device 1352, and compute device 1356 via the network 1354. Master control module 1350 may be local or remote from the tunnel 1302 and plurality of processing cells 1312.

Movement of conveyor 1304 (e.g., when to start moving, stop moving, rate of movement, amount of movement, etc.) may be dictated by signals from the master control module 1350. Infeed and outfeed doors 1308, 1310 may be opened and closed based on signals generated by the master control module 1350. DC power sources may be turned on and off and/or operating parameters (e.g., power) specified by the master control module 1350. One or more of the DC power sources included in the plurality of processing cells 1312 may be configured differently from each other for a given processing of a material of interest.

Master control module 1350 may have one or more communication lines or couplings with each RF generator. For instance, one connection between the master control module 1350 and a RF generator may comprise a control line for the master control module 1350 to turn the RF generator on and off and/or specify operating parameters. Another connection between the master control module 1350 and the RF generator may comprise a monitor line in which the monitored reflected power level output of the RF generator (e.g., signal 320) may be received by the master control module 1350. The received monitored reflected power levels associated with a particular cell may be used by the master control module 1350 to control the stepper motor, and by extension select/adjust the capacitance of the impedance matching module and the match impedance, for the particular cell. Instead of the stepper motor using the reflected power level detected by the RF generator to determine when to re-tune the capacitors in the impedance matching module as in system 100, the master control module 1350 may provide such functionalities, as described in greater detail below. Because the master control module 1350 may be configured to use the reflected power level to control match impedance instead of the stepper motors, stepper motors (e.g., stepper motors 1325, 1335, 1346) need not include a control chip or logic or other determination capability mechanisms, in some embodiments.

Compute device 1352 may be located local to the tunnel 1302, in some embodiments. Compute device 1352 may comprise, without limitation, one or more of a user interface, user control panel, computer, laptop, smart phone, tablet, Internet of Things (IoT) device, wired device, wireless device, and/or the like which may be used by a user or operator to control the system 1300. For example, the user may use compute device 1352 to override the master control module 1350 (e.g., emergency shut down, opening the infeed door 1308) or provide to inputs to be used by the master control module 1350 (e.g., start temperature of the material of interest 708) for efficient operation and/or configuration of the system 1300.

Compute device 1356 may be located remote from the tunnel 1302, in some embodiments. Compute device 1356 may comprise, without limitation, one or more of a user interface, user control panel, computer, laptop, smart phone, tablet, Internet of Things (IoT) device, wired device, wireless device, server, work station, and/or the like capable of at least functionalities of the compute device 1352 and configured to provide additional functionalities such as, but not limited to, data collection, data analytics, diagnostics, system upgrades, remote control, and/or the like. Although not shown, compute device 1356 may also be in communication with other tunnel systems. Compute device 1356 may comprise one or more compute devices distributed over one or more locations.

Compute device 1356 may communicate with the master control module 1350 via the network 1354. Network 1354 may comprise a wired and/or wireless communications network. Network 1354 may include one or more network elements (not shown) to physically and/or logically connect computing devices to exchange data with each other. In some embodiments, network 1354 may be the Internet, a wide area network (WAN), a personal area network (PAN), a local area network (LAN), a campus area network (CAN), a metropolitan area network (MAN), a virtual local area network (VLAN), a cellular network, a WiFi network, a WiMax network, and/or the like. Additionally, in some embodiments, network 1354 may be a private, public, and/or secure network, which may be used by a single entity (e.g., a business, school, government agency, household, person, and the like). Although not shown, network 1354 may include, without limitation, servers, databases, switches, routers, firewalls, base stations, repeaters, software, firmware, intermediating servers, and/or other components to facilitate communication.

In some embodiments, a plurality of materials of interest may be simultaneously processed in the tunnel 1302 at a given time. From one up to N materials of interest may be simultaneously processed in the tunnel 1302, in which each of the materials of interest may be at a different temperature at each point in time since each is at a different point in its process.

Figure 14:
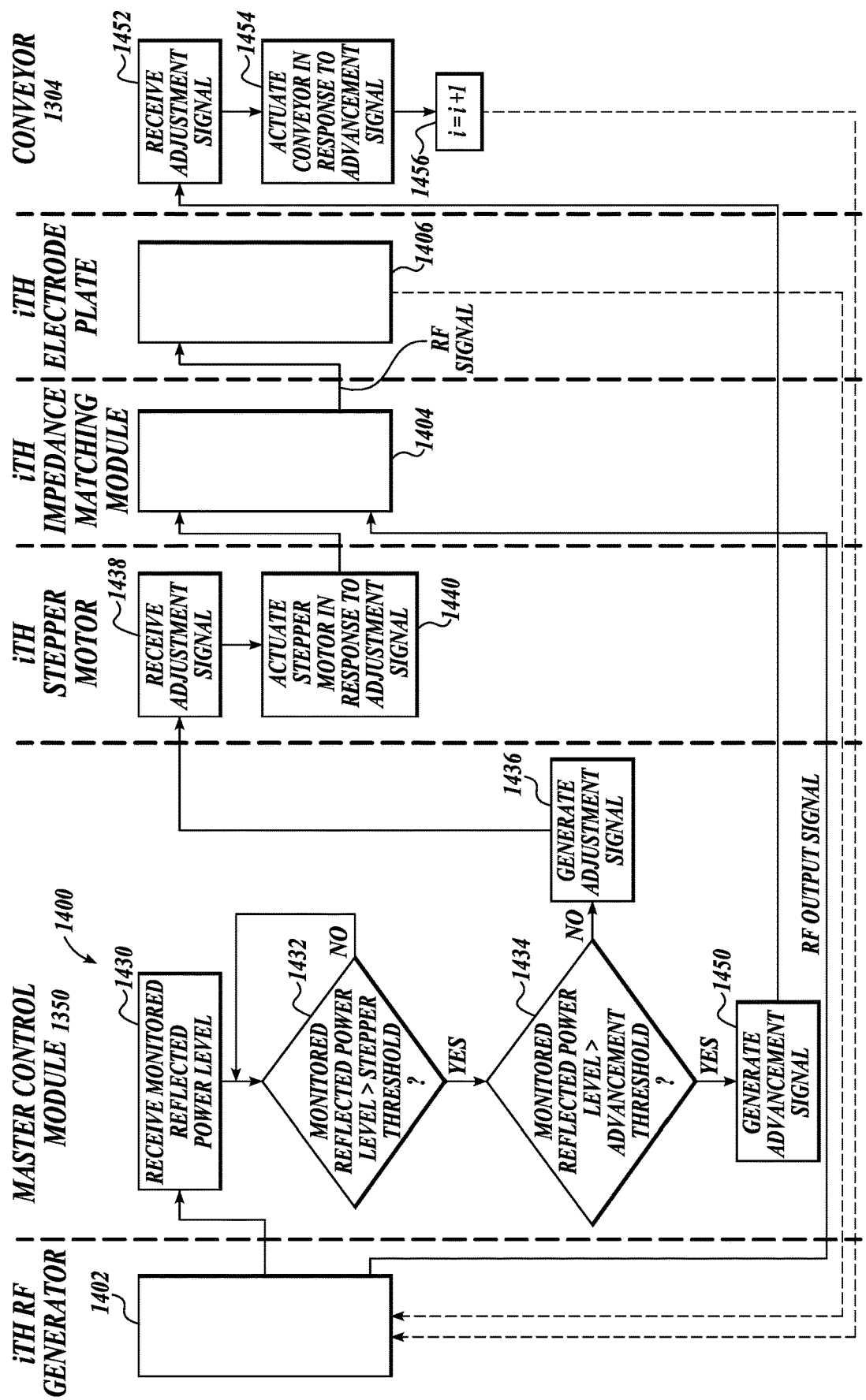
FIG. 14 depicts a process that may be performed by the system of FIG. 13 to thermally process the material of interest, according to some embodiments.

FIG. 14 depicts a process 1400 that may be performed by the system 1300 to thermally process the material of interest 708 initially positioned at the ith cell (e.g., just as the material of interest 708 electrically couples with the ith electrode plate of the ith cell), according to some embodiments. The ith RF generator of the plurality of processing cells 1312 may be configured to perform block 1402, which may be similar to blocks 1102-1112 of FIG. 11. As in block 1106 of FIG. 11, the monitored reflected power level for the ith cell may be available as an output by the ith RF generator, and which may be received by the master control module 1350 at block 1430. Block 1430 may otherwise be similar to block 1130.

Next, at block 1432, the master control module 1350 may be configured to determine whether the received reflected power level exceeds a stepper threshold. The stepper threshold may be similar to the threshold at block 1132 except associated with adjusting the capacitance values of the ith impedance matching module. Block 1432 may otherwise be similar to block 1132. If the stepper threshold is not exceeded (no branch of block 1432), then process 1400 may return to block 1432 to continue monitoring for a too high reflected power level. If the stepper threshold is exceeded (yes branch of block 1432), then the master control module 1350 may be further configured to determine whether the material of interest 708 is at a temperature outside the temperature range associated with the ith cell. The reflected power level may be compared to an advancement threshold. The advancement threshold may comprise a pre-determined threshold value that is larger than the stepper threshold value. For example, the advancement threshold may be 1 V (e.g., approximately 35 W). Alternatively, the number of steps taken by the ith stepper motor and/or the physical state/positions of the variable capacitors in the ith impedance matching module may be detected and used by the master control module 1350 at block 1434 to determine (e.g., compared against a pre-determined value or state) whether the material of interest 708 has completed being processed in the ith cell and is to be advanced to the next cell.

If the advancement threshold is not exceeded (no branch of block 1434), then process 1400 may proceed to block 1436, in which the master control module 1350 may be configured to generate an adjustment signal. This adjustment signal may be similar to the adjustment signal generated in block 1134. The adjustment signal may then be provided to and received by the ith stepper motor, at block 1438. In response, the ith stepper motor may be configured to actuate the ith stepper motor at block 1440.

The ith impedance matching module may respond to actuation of the ith stepper motor and process the RF output signal from the ith RF generator at block 1404. Block 1404 may be similar to that described in connection with blocks 1136-1138 and 1114-1118 of FIG. 11. Likewise, the RF signal outputted by the ith impedance matching module may be received by the ith electrode plate at block 1406. Block 1406 may be similar to those described in connection with blocks 1120-1122 of FIG. 11. Once the (current) RF signal has been applied to the material of interest 708, process 1400 may be deemed to have returned to the operations associated with the ith RF generator for the next RF signal.

If the advancement threshold is exceeded (yes branch of block 1434), then process 1400 may proceed to block 1450. The master control module 1350 may be configured to generate an advancement signal at block 1450. The advancement signal may comprise a signal to move or advance the conveyor 1304 by an amount needed to align or position the material of interest 708 to electrically couple with the next cell (the i+1 cell).

The advancement signal may be provided to and received by the conveyor 1304 (or the mechanical movement mechanism associated with the conveyor 1304), at block 1452. In response to receiving the advancement signal, actuation of conveyor 1304 may occur to move the conveyor 1304 in direction 1305 by the specified amount, at block 1454. With the material of interest now moved to electrically couple with the next cell, i=i+1, at block 1456, and process 1400 may be repeated for the now incremented ith cell. Process 1400 may repeated as described herein for i=1 to N cells.

In alternative embodiments where the conveyor 1304 may already be configured for continuous, incremental, indexed, or other such movement scheme, blocks 1450-1454 may be omitted. For example, conveyor 1304 may be set to move incrementally by an amount sufficient for the material of interest 708 to advance to the next cell every 5 minutes. In such case, process 1400 may determine whether the time period allocated to the cell has elapsed at the yes branch of block 1434. If the time period has elapsed, then process 1400 may proceed to block 145. Conversely if the time period has not elapsed, process 1400 may return to block 1432.

Figure 15:
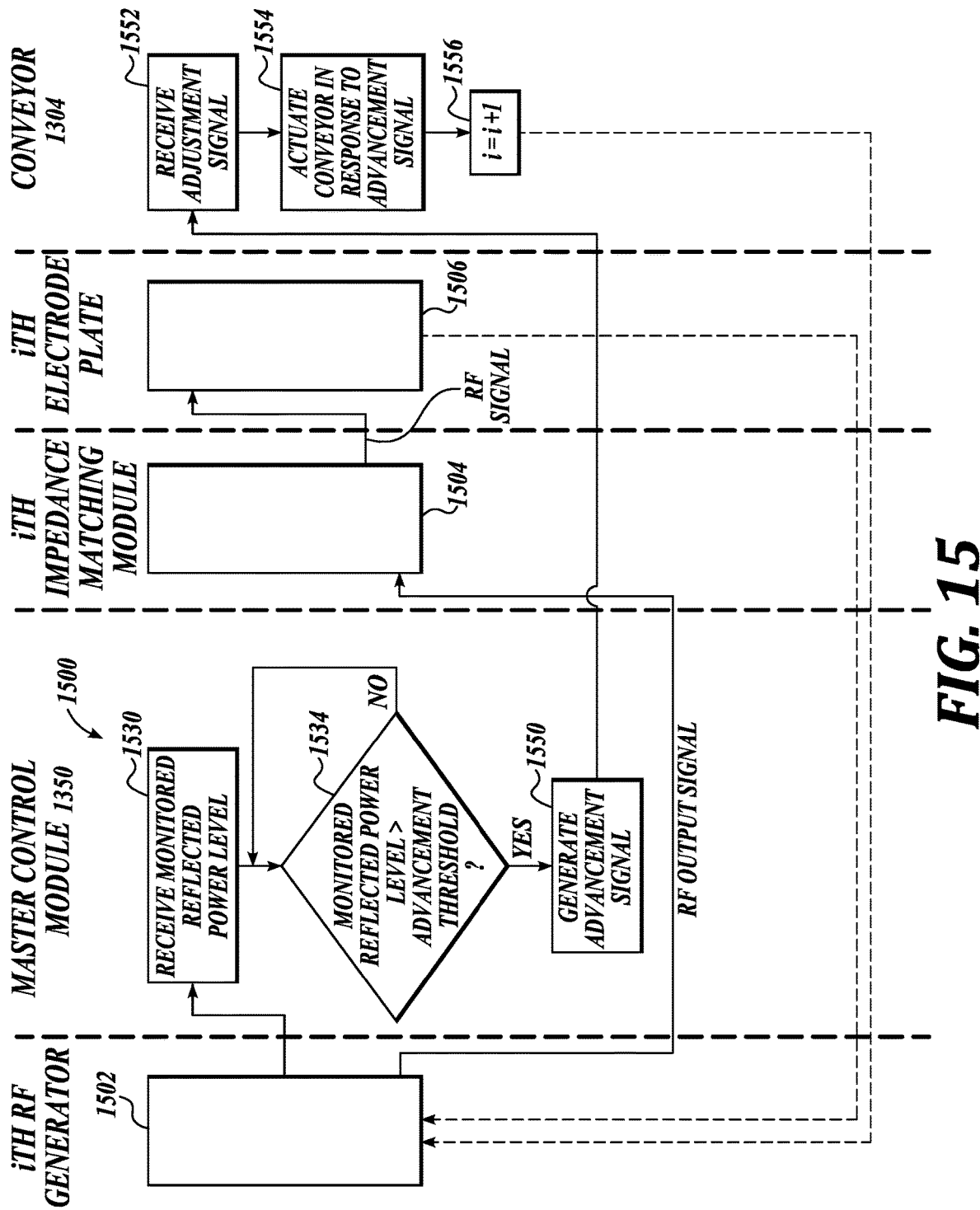
FIG. 15 depicts a process that may be performed by the system of FIG. 13 to thermally process the material of interest, according to alternative embodiments.

FIG. 15 depicts a process 1500 that may be performed by the system 1300 to thermally process the material of interest 708 initially positioned at the ith cell (e.g., just as the material of interest 708 is electrically coupled with the ith electrode plate of the ith cell), according to alternative embodiments. Process 1500 may be similar to process 1400 except process 1500 is directed to operations when the capacitors of the respective impedance matching modules may have fixed capacitance values.

Blocks 1502 and 1530 may be similar to respective blocks 1402 and 1430 of FIG. 14. Master control module 1350 may be configured to monitor the received reflected power level from the ith RF generator to determine whether it exceeds an advancement threshold, at block 1534. Block 1534 may be similar to block 1434. If the advancement threshold is not exceeded (no branch of block 1534), then process 1500 may return to block 1534 to continue monitoring the latest received reflected power level. Otherwise when the advancement threshold is exceeded (yes branch of block 1534), then master control module 1350 may be configured to generate an advancement signal at block 1550. Block 1550 may be similar to block 1450. The advancement signal may be communicated to the conveyor 1304.

In response, conveyor 1304 may be configured to perform operations in blocks 1552, 1554, and 1556 which may be similar to respective blocks 1452, 1454, and 1456. RF output signal provided by the ith RF generator may be received by the ith impedance matching module at block 1504. Block 1504 may be similar to block 1404. RF signal outputted by the ith impedance matching module may be received by the ith electrode plate at block 1506. Block 1506 may be similar to block 1406.

As with process 1400, process 1500 may be repeated as needed for i=1 to N cells to continually thermally process the material of interest 708 from a start, infeed, or incoming temperature to an end, outfeed, or outgoing temperature using the plurality of processing cells 1312.

Figure 16:
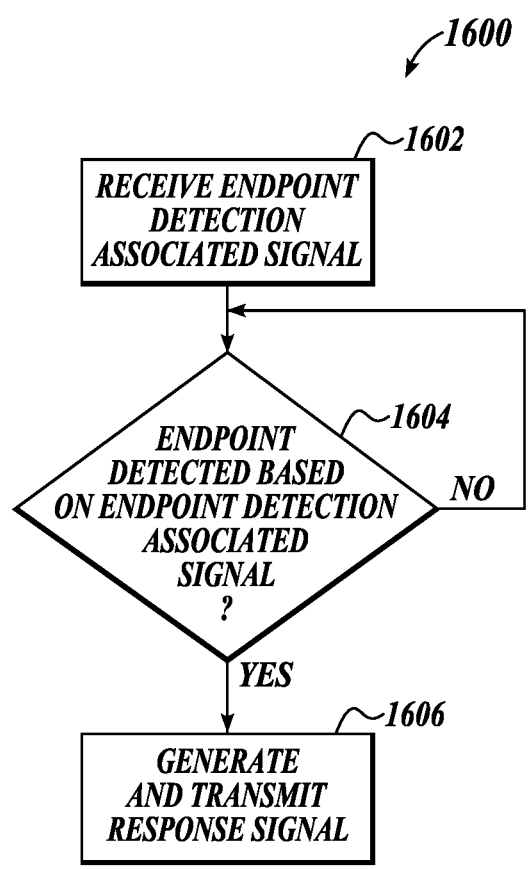
FIG. 16 depicts a process of endpoint detection techniques which may be performed by the system of FIGS. 1 and/or 13, according to some embodiments.

FIG. 16 depicts a process 1600 for endpoint detection techniques which may be performed by the system 100 and/or 1300, according to some embodiments. At block 1602, an endpoint detection associated signal may be received. For system 100, such signal may be received by the control module 314 included in the RF generator 104. Alternatively, such signal may be received by an additional control module included in the system 100. For system 1300, such signal may be associated with a particular cell and may be received by the master control module 1350. The endpoint detection associated signal may comprise one or more of, but not limited to, a reflected power level indication (generated by the directional coupler included in the RF generator), a count of the number of steps taken by the stepper motor (a counter may be maintained by the stepper motor and/or components commanding the stepper motor), an indication of the physical position or state of the variable capacitors included in the impedance matching module (using optical sensors, such as lasers, to sense the physical position or state of the electrode plates of the variable capacitors to determine the distance between the electrode plates), and/or the like.

Next, the received endpoint detection associated signal may be analyzed to determine whether an endpoint has been reached at block 1604. In some embodiments, endpoint detection may refer to detecting a particular processing characteristic, temperature, or state of the material of interest 708. The particular processing characteristic, temperature, or state of interest may be defined by a pre-determined threshold value which may be compared against the endpoint detection associated signal. For system 100, the analysis may be performed by the control module 314 included in the RF generator 104 and/or an additional control module (e.g., circuitry, microprocessor, etc.) included in the system 100. For system 1300, the analysis may be performed by the master control module 1350.

In embodiments where endpoint detection comprises detecting the material of interest 708 having reached the desired end temperature (e.g., endpoint temperature), the endpoint detection associated signal may comprise the reflected power level. Because it is known that the material of interest 708 reaches the end temperature toward the latter part of the processing time period, master control module 1350 may be configured to perform endpoint detection in the last cell (cell N) of the plurality of processing cells 1312 by looking for a particular value of the reflected power level associated with the last cell (e.g., 65 W, 70 W, 75 W, or at least 65 W). For system 100, endpoint detection may comprise looking for a particular value of the reflected power level within the latter time period (e.g., last 15 minutes or so or during a latent zone time period) of the expected processing time period.

When the endpoint detection associated signal comprises a count of the number of steps taken by the stepper motor, master control module 1350 may be configured to monitor the step counter associated with the stepper motor included in the last cell until a particular count is reached. For system 100, the RF generator 104 and/or the additional control module included in the system 100 may also be configured to monitor for a particular count in the step counter associated with the stepper motor 108. Because the steppe motor 108 in system 100 may step through a greater number of steps due to the wider capacitance range for system 100 in comparison to the narrower capacitance range associated with the last cell for system 1300, the particular count values at which endpoint may be deemed to have been reached may differ between systems 100 and 1300.

When the endpoint detection associated signal comprises an indication of the physical position or state of the variable capacitors included in the impedance matching module, master control module 1350 may be configured to monitor for a particular physical position or state of the variable capacitors included in the last cell. For system 100, the RF generator 104 and/or additional control module included in the system 100 may be configured to monitor for a particular physical position or state of the variable capacitors included in the impedance matching module 106. The particular physical positions or states of interest may be different between the systems 100 and 1300.

In other embodiments, endpoint detection may comprise detection of when to advance the material of interest 708 to the next cell. Such detection may be similarly implemented as discussed above except the threshold or other reference characteristics against which the endpoint detection associated signal may be compared may be tailored to be cell specific. In still other embodiments, endpoint detection may comprise detection of the temperature of the material of interest 708. The reflected power level, stepper counter value, and/or indication of the variable capacitor physical position or state may correlate to the temperature of the material of interest 708. For example, the master control module 1350 may configured to detect the actual start temperature of the material of interest 708 in the first cell (cell 1), which may be referred to as start point detection.

As another example, if the material of interest 708 is expected to have a start temperature of −20° C. and the system 1300 is configured for such start temperature (e.g., cell 1 configured for processing between −20 to −17° C., cell 2 configured for processing between −16.9 to −14° C., etc.), but the material of interest 708 may have an actual start temperature of −15° C., then when the material of interest is positioned at the first cell (cell 1) of system 1300, implementing endpoint detection at the first cell may permit detection of the immediate need to advance the material of interest 708 to the second cell (cell 2) since the material of interest 708 is already at a temperature lower than the temperatures associated with/being handled by the first cell. In such case, the material of interest 708 may spend less time at the first cell that nominally allocated for that cell. Alternatively, the first cell may be turned off so that no RF energy is provided by the first cell to that material of interest. If the second cell also has endpoint detection capabilities, then once the material of interest 708 has been positioned at the second cell, components associated with the second cell may detect that the material of interest 708 may be processed to heat from −15° C. to −14° C., rather than the full temperature range of from −16.9 to −14° C. configured for the second cell. Thus, material of interest 708 may also spend less time than nominally allocated to be spent in the second cell.

If the endpoint is not detected (no branch of block 1604), then process 1600 may return to bock 1604 to continue monitoring for the presence of the endpoint. Otherwise when the endpoint has been detected (yes branch of block 1604), then process 1600 may proceed to block 1606. At block 1606, an appropriate response signal may be generated and transmitted. For example, if the endpoint detection comprises determining when to end processing of the material of interest 708 because a desired end temperature has been reached, then the response signal may comprise a signal to shut down the RF generator 104, DC power source 102, and/or system 100. Likewise for system 1300, the response signal may comprise a signal to shut down one or more components included in the last cell, a signal to move the material of interest 708 out of the area associated with the last cell, or the like.

As another example, various thresholds for the reflected power level may be used for power foldback protection, match impedance adjustment, and/or endpoint detection. For power foldback protection, the threshold may be 2.5 V (e.g., approximately 90 W) for a RF generator operating at up to 1250 W and the threshold may be 1.8 V (e.g., approximately 65 W) for a RF generator operating at up to 2000 W. For match impedance adjustment, the (stepper) threshold may be set to 1 V (e.g., approximately 35 W). For endpoint detection at which RF signal/energy to the material of interest is halted, the threshold may be 1.8 V (e.g., approximately 65 W) for a RF generator operating at up to 1250 W.

In some embodiments, for endpoint detection, even when the stepper threshold may be exceeded, the capacitors may not be adjusted. Instead, the reflected power level may be intentionally allowed to increase, at least during the latter time period of processing the material of interest, until a reflected power level of approximately 65 W is detected. At this point in time, processing of the material of interest may be stopped since reflected power level at approximately 65 W corresponds to the material of interest being at −3° C.±1° C.

In some embodiments, detection of the reflected power level may permit the temperature of the material of interest to be known, in system 100 and at each cell of system 100. The reflected power level may be monitored to within 1% accuracy of a desired endpoint reflected power level (e.g., 65 W) or to an accuracy of less than 1 W. Reflected power level values may range between slightly higher than zero to 65 W, with 65 W corresponding to −3° C. and about 10 W corresponding to −20° C.

In some embodiments, as the distance 716 increases between electrode plates 702 and 704 (e.g., to process larger materials of interest), the current at the second capacitor 810 (C2) may increase for a given temperature of the material of interest. In order for the circuit 800, and in particular, the second capacitor 810 to be able to handle the higher currents without exceeding the capacitor's current limitation, one or more additional capacitors may be provided in parallel with second capacitor 810 in circuit 800. For example, for a distance 716 of approximately 12 inches, three additional capacitors of 10 pF each may be included in parallel with second capacitor 810.

Moreover, as distance 716 increases, capacitive reactance of the capacitance 722 increases. In order for the circuit 800 to provide matching impedance to the load, an increase in inductance associated with the transformer 808 may be required to match the increased capacitive reactance. For example, inductance of the each of the primary and secondary windings of the transformer 808 may be 0.26 μH for distance 716 of approximately 6 inches, 0.31 μH for distance 716 of approximately 8 inches, and 0.4 μH for distance 716 of approximately 12 inches.

In some embodiments, a certain amount of reflected power level may facilitate a higher DC to RF power efficiency (e.g., up to 84 or 85%) than if the reflected power level is lowered by better matching the impedance between the load and the RF generator. In other words, intentionally imperfect impedance match may increase the DC to RF power efficiency to up to 84 or 85%. The table below shows various DC to RF power efficiencies at different phase angles between the RF generator and the load for a reflected power level of 6%, a reflection coefficient of the mismatch at 0.25, and a 1.7:1 voltage standing wave ratio (VSWR).

| Phase angle (degrees) | Forward power (in V) | Reflected power (in V) | Forward power (W) | Load power (W) | Current (A) | Power dissipation | DC to RF power efficiency (%) |
|---|---|---|---|---|---|---|---|
| Initial | 9.8 | 2.5 | 1220 | 1147 | 42 | 133 | 68 |
| 30 | 9.1 | 2.0 | 1078 | 1013 | 34 | 87 | 74 |
| 60 | 9.0 | 1.8 | 1080 | 1015 | 28 | 26 | 90 |
| 90 | 9.3 | 1.4 | 1220 | 1147 | 34 | 53 | 84 |
| 120 | 8.5 | 1.8 | 1060 | 996 | 39 | 141 | 64 |
| 150 | 8.8 | 2.0 | 1100 | 1034 | 42 | 162 | 62 |

A phase angle of 90 degrees between the RF generator and the material of interest/load may be set, especially during the latent zone time period (the last portion of processing time when load temperature is at −5 to −3° C.), by controlling a length of the coaxial cable between the RF generator and electrodes coupling to the load. The resulting DC to RF power efficiency may increase to 84% from approximately 75% (the efficiency under the matched impedance condition when reflected power may be zero). A certain amount of reflected power results in a higher efficiency at some phase angles. A fixed match impedance may be used for a certain temperature range. The reflected power may be allowed to go from zero W to 75 W (6%) during the RF processing of the load. The fixed match and particular phase angle technique may be beneficial for loads whose load impedance changes slowly over time. Loads in the latent zone are examples of when the load impedance changes slowly over time. The match impedance and phase angle may be adjusted to achieve DC to RF power efficiency higher than may be possible with a matched impedance between the RF generator and load. In some embodiments, a DC current meter coupled between the RF generator and DC power source along with a power meter coupled between the RF generator and the impedance matching module may be used to optimize the phase angle, and in turn, the coaxial cable length, between the RF generator and load for increased DC to RF power efficiency up to approximately 84 or 85%.

In this manner, monitored reflected power levels may be used to provide power foldback protection, to dynamically adjust match impedance, to determine the load temperature during/throughout the RF application, and/or to determine when to end the RF signal applied to the load since the desired endpoint temperature has been reached.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Illustrative examples of the devices, systems, and methods of various embodiments disclosed herein are provided below. An embodiment of the devices, systems, and methods may include any one or more, and any combination of, the examples described below.

1. A system comprising:
a plurality of radio frequency (RF) generators;
a plurality of impedance match modules;
a plurality of electrode plates, first and second impedance match modules of the plurality of impedance match modules electrically coupled between respective first and second RF generators of the plurality of RF generators and respective first and second electrode plates of the plurality of electrode plates; and
a conveyor including a ground electrode,
wherein, when a load at a start temperature is to be placed on the conveyor, the system uses RF signals generated by the plurality of RF generators to cause the load to be at an end temperature different from the start temperature, wherein the conveyor is to position the load to electrically couple to the first electrode plate during a first time period and the first impedance match module is associated with a first range of temperatures between the start and end temperatures, and wherein the conveyor is to position the load to electrically couple to the second electrode plate during a second time period and the second impedance match module is associated with a second range of temperatures between the start and end temperatures that is different from the first range of temperatures.

2. The system of clause 1, further comprising a plurality of direct current (DC) power sources and a master control module, wherein first and second DC power sources of the plurality of DC power sources are electrically coupled to respectively the first and second RF generators, and wherein the master control module is in communication with the first and second RF generators.

3. The system of clause 2, further comprising a plurality of stepper motors, wherein first and second stepper motors of the plurality of stepper motors are electrically coupled to respectively the first and second impedance match modules, and wherein the master control module is in communication with the first and second stepper motors.

4. The system of claim 3, wherein the first impedance match module includes variable capacitors, and wherein the first stepper motor, under control by the master control module, changes a match impedance associated with the first impedance match module between the first RF generator and the load by changing a capacitance of the variable capacitors.

5. The system of clause 2, wherein the master control module is to use indications of reflected power level provided by the first RF generator to determine when to reposition the load from the first electrode plate to the second electrode plate.

6. The system of clause 2, wherein the first DC power source provides a first DC signal to the first RF generator, and the first RF generator converts the first DC signal to a first RF signal having a DC to RF power efficiency greater than 50%.

7. The system of clause 1, wherein the first impedance match module has a first capacitance range different from a second capacitance range of the second impedance match module.

8. The system of clause 1, wherein the end temperature is between −4 to −2° Celsius (C), a temperature below 0° C., or a temperature below at which drip loss occurs for the load.

9. The system of clause 1, wherein the start temperature is lower than the end temperature.

10. The system of clause 1, wherein the first impedance match module includes fixed or variable capacitors and capacitance values associated with the fixed or variable capacitors are selected for a first match impedance associated with the first impedance match module to match a first load impedance associated with the load during the first time period.

11. The system of clause 10, wherein the second impedance match module includes second fixed or variable capacitors and capacitance values associated with the second fixed or variable capacitors are selected for a second match impedance associated with the second impedance match module to match a second load impedance associated with the load during the second time period, wherein the first and second load impedances are different from each other.

12. The system of clause 1, wherein the plurality of electrode plates is disposed above the conveyor and distributed along the length of the conveyor, and wherein a last electrode plate of the plurality of electrode plates is associated with causing the load to be at the end temperature.

13. A method comprising:
positioning a load to electrically couple with a first electrode plate for a first time period, wherein a first impedance match module is electrically coupled between the first electrode plate and a first radio frequency (RF) generator, and wherein the first impedance match module is associated with a first range of temperatures between a start temperature and an end temperature associated with the load;
applying a first RF signal to the load for a portion of the first time period during which the load is at a temperature within the first range of temperatures, the first RF signal comprising a RF signal generated by the first RF generator and impedance matched by the first impedance match module;
positioning the load to electrically couple with a second electrode plate for a second time period, wherein a second impedance match module is electrically coupled between the second electrode plate and a second RF generator, and wherein the second impedance match module is associated with a second range of temperatures between the start and end temperatures different from the first range of temperatures; and
applying a second RF signal to the load for a portion of the second time period during which the load is at a temperature within the second range of temperatures, the second RF signal comprising another RF signal generated by the second RF generator and impedance matched by the second impedance match module.

14. The method of clause 13, further comprising:
generating, by a first direct current (DC) power source, a first DC signal and applying the first DC signal to drive the first RF generator; and
generating, by a second DC power source, a second DC signal and applying the second DC signal to device the second RF generator.

15. The method of clause 14, wherein the first RF signal comprises a signal having a DC to RF power efficiency of 75 to 80%, and wherein a power of the first RF signal is approximately up to 10 kiloWatt (kW).

16. The method of clause 13, further comprising:
receiving, from the first RF generator, an indication of a first reflected power level associated with processing of the load using the first RF generator, impedance match module, and electrode plate;
determining whether the indication of the first reflected power level exceeds a threshold; and
when the determination is affirmative, causing the load to be positioned to electrically couple with the second electrode plate.

17. The method of clause 16, wherein when the determination is negative, changing a first match impedance associated with the first impedance match module, wherein the first match impedance is changed for the next first reflected power level to be smaller than the first reflected power level.

18. The method of clause 17, wherein changing the first match impedance associated with the first impedance match module comprises adjusting, using a first stepper motor, a capacitance of one or more variable capacitors included in the first impedance match module.

19. The method of clause 13, wherein the start temperature is lower than the end temperature.

20. The method of clause 13, wherein the first impedance match module includes fixed or variable capacitors and capacitance values associated with the fixed or variable capacitors are selected for a first match impedance associated with the first impedance match module to match a first load impedance associated with the load during the first time period.

21. The method of clause 20, wherein the second impedance match module includes second fixed or variable capacitors and capacitance values associated with the second fixed or variable capacitors are selected for a second match impedance associated with the second impedance match module to match a second load impedance associated with the load during the second time period, wherein the first and second load impedances are different from each other.

22. The method of clause 13, wherein the end temperature is between −4 to −2° Celsius (C), a temperature below 0° C., or a temperature below at which drip loss occurs for the load, and wherein a total time period for the load to heat from the start temperature to the end temperature comprises less than an hour.

23. The method of clause 13, wherein the load comprises protein, carbohydrates, foods, biologic material, fruits, vegetables, dairy, grains, or non-food materials.

24. An apparatus comprising:
means for positioning a load to electrically couple with a first electrode plate for a first time period, wherein a first means to match impedance is electrically coupled between the first electrode plate and a first radio frequency (RF) generator, and wherein the first means to match impedance is associated with a first range of temperatures between a start temperature and an end temperature associated with the load;
means for applying a first RF signal to the load for a portion of the first time period during which the load is at a temperature within the first range of temperatures, the first RF signal comprising a RF signal generated by the first RF generator and impedance matched by the first means to match impedance;
means for positioning the load to electrically couple with a second electrode plate for a second time period, wherein a second means to match impedance is electrically coupled between the second electrode plate and a second RF generator, and wherein the second means to match impedance is associated with a second range of temperatures between the start and end temperatures different from the first range of temperatures; and means for applying a second RF signal to the load for a portion of the second time period during which the load is at a temperature within the second range of temperatures, the second RF signal comprising another RF signal generated by the second RF generator and impedance matched by the second means for matching impedance.

25. The apparatus of clause 24, further comprising:
means for generating a first DC signal and applying the first DC signal to drive the first RF generator; and
means for generating a second DC signal and applying the second DC signal to device the second RF generator.

26. The apparatus of clause 24, wherein the first RF signal comprises a signal having a DC to RF power efficiency of 75 to 80%, and wherein a power of the first RF signal is up to approximately 10 kiloWatt (kW).

27. The apparatus of clause 24, further comprising:
means for receiving, from the first RF generator, an indication of a first reflected power level associated with processing of the load using the first RF generator, means for matching impedance, and electrode plate;
means for determining whether the indication of the first reflected power level exceeds a threshold; and
when the determination is affirmative, means for causing the load to be positioned to electrically couple with the second electrode plate.

28. The apparatus of clause 27, wherein when the determination is negative, means for changing a first match impedance associated with the first means for matching impedance, wherein the first match impedance is changed for the next first reflected power level to be smaller than the first reflected power level.

29. The apparatus of clause 28, wherein the means for changing the first match impedance associated with the first means for changing impedance comprises means for adjusting a capacitance of one or more variable capacitors included in the first means for matching impedance.

30. The apparatus of clause 24, wherein the end temperature is between −4 to −2° Celsius (C), a temperature below 0° C., or a temperature below at which drip loss occurs for the load, and wherein a total time period for the load to heat from the start temperature to the end temperature comprises less than an hour.

31. A device comprising:
a first capacitor in parallel with an inductor;
primary windings of a transformer in series with the first capacitor and the inductor; and
a second capacitor in series with secondary windings of the transformer,
wherein a radio frequency (RF) input signal is applied to the first capacitor and the primary windings of the transformer outputs a RF output signal, and wherein an impedance associated with the device is to match an impedance associated with a load in series with the device.

32. The device of clause 31, wherein the first and second capacitors comprise variable capacitance capacitors.

33. The device of clause 31, wherein the first and second capacitors comprise fixed capacitance capacitors.

34. The device of clause 31, further comprising one or more third capacitors in parallel with the first or second capacitors.

35. The device of clause 31, wherein a capacitance associated with the first capacitor is approximately 16 to 250 picoFarad (pF).

36. The device of clause 31, wherein a capacitance associated with the second capacitor is approximately 16 to 80 picoFarad (pF).

37. The device of clause 31, wherein an inductance associated with the inductor is approximately 74 nanoHenry (nH).

38. The device of clause 31, wherein an inductance associated with the primary windings of the transformer is approximately 0.26-0.28 microHenry (μH) or approximately 0.31 μH.

39. The device of clause 31, wherein an inductance associated with the secondary windings of the transformer is approximately 0.26-0.28 microHenry (μH) or approximately 0.31 μH.

40. The device of clause 31, wherein the transformer comprises an air core type of transformer.

41. An apparatus comprising:
a first capacitor in parallel with an inductor;
primary windings of a transformer in series with the first capacitor and the inductor; and
a second capacitor in series with secondary windings of the transformer,
wherein the primary and secondary windings comprise flat conductive strips, and the transformer comprises the primary windings wound around an outer circumferential surface of a tube and the secondary windings wound around an inner circumferential surface of the tube.

42. The apparatus of clause 41, wherein the tube comprises Teflon and has dimensions to provide a coefficient of coupling of 0.76 for the transformer.

43. The apparatus of clause 41, wherein the flat conductive strip of respective primary and secondary windings is 0.06 inch thick and 0.375 inch wide.

44. The apparatus of clause 41, wherein the flat conductive strip of respective primary and secondary windings have the same length as each other.

45. The apparatus of clause 41, wherein an inductance associated with the primary or secondary windings of the transformer is approximately 0.26-0.28 microHenry (μH) or approximately 0.31 μH.

46. The apparatus of clause 41, wherein the first and second capacitors comprise variable capacitance capacitors or fixed capacitance capacitors.

47. The apparatus of clause 41, further comprising one or more third capacitors in parallel with the first or second capacitors.

48. The apparatus of clause 41, wherein a capacitance associated with the first capacitor is approximately 16 to 250 picoFarad (pF).

49. The apparatus of clause 41, wherein a capacitance associated with the second capacitor is approximately 16 to 80 picoFarad (pF).

50. The apparatus of clause 41, wherein an inductance associated with the inductor is approximately 74 nanoHenry (nH).

51. A method comprising:
changing capacitance of one or both of first and second capacitors included in an impedance match module in series between a radio frequency (RF) generator and a load, wherein the change is initiated in accordance with a first reflected power level, and wherein the first capacitor is in parallel with an inductor, primary windings of a transformer is in series with the first capacitor and the inductor, and the second capacitor is in series with secondary windings of the transformer; and generating a RF output signal based on a RF signal received from the RF generator and in accordance with the changed capacitance of the first and second capacitors in the impedance match module, wherein a second reflected power level at a time after the first reflected power level is less than the first reflected power level.

52. The method of clause 51, wherein changing the capacitance comprises changing a match impedance associated with the impedance match module to improve matching a load impedance associated with the load.

53. The method of clause 51, wherein changing the capacitance is initiated when the first reflected power level exceeds a threshold.

54. The method of clause 53, wherein the threshold is approximately 35 Watt (W).

55. The method of clause 51, wherein the first reflected power level is detected in the RF generator.

56. The method of clause 51, wherein the second capacitor comprises a plurality of capacitors in parallel with each other.

57. The method of clause 51, wherein changing the capacitance comprises reducing the capacitance of one or both of the first and second capacitors.

58. The method of clause 51, wherein an inductance associated with the primary or secondary windings of the transformer is approximately 0.26-0.28 microHenry (µH) or approximately 0.31 µH, and an inductance associated with the inductor is approximately 74 nanoHenry (nH).

59. The method of clause 51, wherein a capacitance associated with the first capacitor is approximately 16 to 250 picoFarad (pF).

60. The apparatus of clause 51, wherein a capacitance associated with the second capacitor is approximately 16 to 80 picoFarad (pF).

61. An apparatus comprising:
a control module;
an oscillator module that is to convert a direct current (DC) signal into a radio frequency (RF) signal;
a power amplifier module coupled to an output of the oscillator module, the power amplifier module is to amplify a power associated with the RF signal in accordance with a bias signal from the control module to generate an amplified RF signal; and
a directional coupler module coupled to an output of the power amplifier module, the directional couple module is to detect at least a reflected power and to provide the detected reflected power to the control module,
wherein the control module is to generate the bias signal based on the detected reflected power and is to provide the detected reflected power as an available monitored output of the apparatus.

62. The apparatus of clause 61, wherein the oscillator module receives the DC signal from a DC power source, and the DC signal is at 42 Volt (V).

63. The apparatus of clause 61, wherein the power amplifier module is to generate the amplified RF signal having a power range between 0 to 10 kiloWatt (kW).

64. The apparatus of clause 61, wherein the power amplifier module includes a plurality of laterally diffused metal oxide semiconductor (LDMOS) transistors arranged in a push-pull configuration.

65. The apparatus of clause 64, wherein a LDMOS transistor of the plurality of LDMOS transistors is to amplify a power of an input signal by approximately 30 decibel (dB).

66. The apparatus of clause 61, wherein the power amplifier module includes a circuit having first and second branches at an input side and the first and second branches combined at an output side, wherein the first and second branches are the same as each other.

67. The apparatus of clause 66, wherein the first branch includes an input stage coupled to an input transformer stage, the input transformer stage coupled to a laterally diffused metal oxide semiconductor (LDMOS) transistor stage, the LDMOS transistor stage coupled to an output transformer stage, the output transformer stage coupled to a signal combiner stage, and the signal combiner stage coupled to an output stage, wherein the input stage receives the RF signal and the output stage outputs the amplified RF signal.

68. The apparatus of clause 67, wherein the signal combiner stage and the output stage are shared by the first and second branches.

69. The apparatus of clause 67, wherein the output transformer stage includes a non-ferrite based transformer or a tube transformer using powdered iron toroids.

70. The apparatus of clause 67, wherein first and second impedances associated with respective first and second inputs of the signal combiner stage excludes 25 Ohm (Ω).

71. The apparatus of clause 61, wherein the power amplifier module has a DC to RF power efficiency of 75 to 80% or greater than 50%.

72. The apparatus of clause 61, wherein the directional coupler module comprises a transformer type directional coupler and the directional coupler module is to provide the amplified RF signal as an RF output signal of the apparatus.

73. The apparatus of clause 72, wherein the RF output signal has a frequency of 27.12 MHz, 27 MHz, approximately 27 MHz, between 13 to 100 MHz, or a RF frequency that is not a resonant frequency associated with an electrode structure providing the RF output signal to a load.

74. The apparatus of clause 61, wherein the directional coupler module is to detect a forward power and to provide the detected forward power to the control module.

75. The apparatus of clause 61, wherein the control module is to determine whether the detected reflected power exceeds a threshold.

76. The apparatus of clause 75, wherein when the threshold is exceeded, reduce the bias signal, wherein the threshold is associated with a soft foldback protection, and wherein the bias signal is a value greater than zero.

77. The apparatus of clause 61, further comprising a voltage regulator module coupled to an input of the oscillator module, the voltage regulator module is to reduce a voltage associated with an input DC signal received from a DC power source.

78. A method comprising:
converting a direct current (DC) signal into a radio frequency (RF) signal;
amplifying a power associated with the RF signal in accordance with a bias signal from a control module to generate an amplified RF signal;
detecting at least a reflected power and providing the detected reflected power to the control module; and
generating the bias signal based on the detected reflected power and providing the detected reflected power as an available monitored output.

79. The method of clause 78, wherein amplifying the power associated with the RF signal comprises amplifying the RF signal to a power range between 0 to 10 kiloWatt (kW).

80. The method of clause 78, wherein amplifying the power associated with the RF signal comprises amplifying the RF signal by approximately 30 decibel (dB) using laterally diffused metal oxide semiconductor (LDMOS) transistors arranged in a push-pull configuration.

81. The method of clause 78, wherein amplifying the power associated with the RF signal comprises amplifying the RF signal to become the amplified RF signal at a DC to RF power efficiency of 75 to 80% or greater than 50%.

82. The method of clause 78, further comprising detecting a forward power and providing the detected forward power to the control module.

83. The method of clause 78, further comprising determining whether the detected reflected power exceeds a threshold.

84. The method of clause 83, wherein when the threshold is exceeded, reducing the bias signal by a particular amount, wherein the threshold is associated with a soft foldback protection, and wherein the bias signal is a value greater than zero.

85. An apparatus comprising:
means for converting a direct current (DC) signal into a radio frequency (RF) signal;
means for amplifying a power associated with the RF signal in accordance with a bias signal from a means for controlling to generate an amplified RF signal;
means for detecting at least a reflected power and providing the detected reflected power to the means for controlling; and
means for generating the bias signal based on the detected reflected power and providing the detected reflected power as an available monitored output.

86. The apparatus of clause 85, wherein the means for amplifying the power associated with the RF signal comprises means for amplifying the RF signal by approximately 30 decibel (dB) using laterally diffused metal oxide semiconductor (LDMOS) transistors arranged in a push-pull configuration.

87. The apparatus of clause 85, wherein the means for amplifying the power associated with the RF signal comprises means for amplifying the RF signal to become the amplified RF signal at a DC to RF power efficiency of 75 to 80% or greater than 50%.

88. The apparatus of clause 85, further comprising means for detecting a forward power and means for providing the detected forward power to the means for controlling.

89. The apparatus of clause 88, further comprising means for determining whether the detected reflected power exceeds a threshold, and when the threshold is exceeded, means for reducing the bias signal by a particular amount to reduce an amount of amplification of the RF signal in the means for amplifying, wherein the bias signal is a value greater than zero.

90. The apparatus of clause 85, wherein the means for converting, means for amplifying, means for detecting, and means for generating are included in a first air tight compartment, wherein the means for converting, means for amplifying, means for detecting, and means for generating are provided on respective printed circuit boards (PCBs) spaced apart from each other in the first air tight compartment, and further comprising a heat sink in contact with the respective PCBs, the heat sink at least partially located within a second air cooled compartment adjacent to the first air tight compartment.

91. An apparatus comprising:
a radio frequency (RF) generator that is to generate a RF signal;
first and second electrodes; and
an impedance match module in series between the RF generator and the first electrode,
wherein the RF generator detects reflected power from the RF signal applied to a load electrically coupled between the first and second electrodes to change a temperature of the load, the RF signal to be applied to the load until the reflected power reaches a particular value.

92. The apparatus of clause 91, further comprising a direct current (DC) source that provides a DC signal to the RF generator, the RF generator to generate the RF signal based on the DC signal, wherein the RF signal is at a frequency of 27.12 MHz, 27 MHz, approximately 27 MHz, or a RF frequency that is not a resonant frequency associated with an electrode structure providing the RF signal to the load.

93. The apparatus of clause 92, wherein the RF generator has associated output impedance of 50 Ohm ($\Omega$), and wherein the RF generator includes laterally diffused metal oxide semiconductor (LDMOS) transistors and non-ferrite based transformers to power amplify the DC signal.

93. The apparatus of clause 91, wherein the load comprises protein, carbohydrates, foods, biologic material, fruits, vegetables, dairy, grains, or non-food materials.

94. The apparatus of clause 91, wherein the impedance match module includes a first capacitor in parallel with an inductor, primary windings of a transformer in series with the first capacitor and the inductor, and a second capacitor in series with secondary windings of the transformer.

95. The apparatus of clause 91, wherein the RF signal is applied to the load to change the temperature of the load from a start temperature to an end temperature, wherein the end temperature is higher than the start temperature, wherein the end temperature is between −4 to −2° Celsius (C), a temperature below 0° C., or a temperature below at which drip loss occurs for the load.

96. The apparatus of clause 95, wherein the particular value is 65 Watt (W), 70 W, or 75 W, and when the RF signal is at the particular value, the temperature of the load is at the end temperature.

97. The apparatus of clause 91, wherein the apparatus comprises a first cell of a plurality of cells, wherein the first cell is to change the temperature of the load from a first temperature to a second temperature during a first time period, and a second cell of the plurality of cells is to change to temperature of the load from the second temperature to a third temperature during a second time period, wherein the third temperature is higher than the second temperature and the second temperature is higher than the first temperature.

98. The apparatus of clause 97, wherein a last cell of the plurality of cells is to change the temperature of the load to an end temperature that is between −4 to −2° Celsius (C), a temperature below 0° C., or a temperature below at which drip loss occurs for the load.

99. The apparatus of clause 97, wherein the impedance match module included in the first cell includes variable capacitors tunable within a first capacitance range associated with a temperature range between the first and second temperatures, and wherein a second impedance match module included in the second cell includes variable capacitors tunable within a second capacitance range associated with the temperature range between the second and third temperatures.

100. The apparatus of clause 99, wherein the second cell includes a stepper motor coupled to the second impedance match module, the stepper motor is to change capacitance of capacitors included in the second impedance match module when the reflected power associated with the second cell exceeds a threshold smaller than the particular value.

101. The apparatus of clause 100, wherein the threshold is approximately 35 W.

102. The apparatus of clause 91, further comprising a stepper motor that is to receive the reflected power and, when the reflected power exceeds a threshold, the stepper motor is to change capacitance of capacitors included in the impedance match module to change a match impedance of the impedance match module, wherein the threshold is smaller than the particular value.

103. The apparatus of clause 102, wherein when a time duration of the RF signal applied to the load is at least 30 minutes or the apparatus comprises a last cell of a plurality of processing cells of the load, the capacitance of the capacitors included in the impedance match module is not changed when the threshold is exceeded.

104. The apparatus of clause 91, wherein, when the temperature of the load is within a latent zone from frozen to liquid, set a phase angle between the RF generator and the load to 90 degrees, and wherein a match impedance associated with the impedance match module is mismatched from a load impedance associated with the load.

105. The apparatus of clause 104, wherein a power efficiency of the apparatus when the temperature of the load is within the latent zone is approximately 85%.

106. The apparatus of clause 91, wherein the RF generator is to determine whether the reflected power exceeds a threshold, and when the threshold is exceeded, reduce a power of the RF signal applied to the load.

107. The apparatus of clause 106, wherein the threshold is approximately 90 Watt (W) for the RF generator that has a power range up to 1250 W.

108. The apparatus of clause 106, wherein the threshold is approximately 65 Watt (W) for the RF generator that has a power range up to 2000 W.

109. The apparatus of clause 106, wherein the threshold is greater than the particular value, and wherein the RF generator reduces the power of the RF signal to a power level greater than zero Watt (W).

110. The apparatus of clause 91, wherein the RF generator is to determine a temperature of the load based on the reflected power.

111. The apparatus of clause 110, wherein the RF generator is to determine the temperature of the load to within a 1% accuracy of an actual temperature of the load.

112. A method comprising:
applying a radio frequency (RF) signal to a load;
monitoring a reflected power level associated with an apparatus including a direct current (DC) source, an impedance match module, a radio frequency (RF) generator, and the load; and
determining a temperature of the load based on the reflected power level.

113. The method of clause 112, wherein monitoring the reflected power level comprises monitoring the reflected power level to within 1% accuracy of an endpoint reflected power level or an accuracy of within less than 1 Watt (W).

114. The method of clause 112, wherein applying the RF signal to the load comprises applying the RF signal to change the temperature of the load from a start temperature to an end temperature higher than the start temperature.

115. The method of clause 114, wherein the end temperature is between −4 to −2° Celsius (C), a temperature below 0° C., or a temperature below at which drip loss occurs for the load.

116. The method of clause 112, further comprising determining when to stop applying the RF signal to the load based on the reflected power level.

117. The method of clause 116, wherein determining when to stop applying the RF signal comprises determining whether the reflected power level is at least 65 Watt (W).

118. The system of clause 1, wherein the conveyor moves continuously to position the load from the first electrode plate to the second electrode plate.

119. The system of clause 1, wherein the conveyor moves incrementally to position the load from the first electrode plate to the second electrode plate.

120. The system of clause 1, wherein the first RF generator is to monitor a reflected power to determine a temperature of the load, the reflected power monitored to be accurate within 1% of an endpoint reflected power level or have an accuracy of within less than 1 Watt (W).

121. The method of clause 13, wherein positioning the load to electrically couple with the second electrode plate comprises continuously moving the load from the first electrode plate to the second electrode plate.

122. The method of clause 13, wherein positioning the load to electrically couple with the second electrode plate comprises moving the load from the first electrode plate to the second electrode plate in a step motion.

123. The method of clause 13, further comprising:
monitoring a reflected power level associated with the load during the first time period; and
determining a temperature of the load based on the reflected power level.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

We claim:

1. A system comprising:
a plurality of radio frequency (RF) generators;
a plurality of impedance match modules;
a plurality of electrode plates, a first impedance match module and a second impedance match module of the plurality of impedance match modules being electrically coupled between a first RF generator and a second RF generator of the plurality of RF generators and a respective first electrode plate and a second electrode plate of the plurality of electrode plates;
a plurality of direct current (DC) power sources and a master control module, wherein a first power source and a second DC power source of the plurality of DC power sources are electrically coupled to respectively the first RF generator and the second RF generator, and wherein the master control module is in communication with the first RF generator and the second RF generator; and
a conveyor including a ground electrode,
wherein, when a load at a start temperature is to be placed on the conveyor, the system uses RF signals generated by the plurality of RF generators to cause the load to be at an end temperature different from the start temperature, wherein the conveyor is to position the load to electrically couple to the first electrode plate during a first time period and the first impedance match module is associated with a first range of temperatures between the start and end temperatures, and wherein the conveyor is to position the load to electrically couple to the second electrode plate during a second time period and the second impedance match module is associated with a second range of temperatures between the start and end temperatures that is different from the first range of temperatures.

2. The system of claim 1, further comprising a plurality of stepper motors, wherein first and second stepper motors of the plurality of stepper motors are electrically coupled to respectively the first and second impedance match modules, and wherein the master control module is in communication with the first and second stepper motors.

3. The system of claim 2, wherein the first impedance match module includes variable capacitors, and wherein the first stepper motor, under control by the master control module, changes a match impedance associated with the first impedance match module between the first RF generator and the load by changing a capacitance of the variable capacitors.

4. The system of claim 1, wherein the master control module is to use indications of reflected power level provided by the first RF generator to determine when to reposition the load from the first electrode plate to the second electrode plate.

5. The system of claim 1, wherein the first DC power source provides a first DC signal to the first RF generator, and the first RF generator converts the first DC signal to a first RF signal having a DC to RF power efficiency greater than 50%.

6. The system of claim 1, wherein the first impedance match module has a first capacitance range different from a second capacitance range of the second impedance match module.

7. The system of claim 1, wherein the end temperature is between −4 to −2° Celsius (C), a temperature below 0° C., or a temperature below at which drip loss occurs for the load.

8. The system of claim 1, wherein the start temperature is lower than the end temperature.

9. The system of claim 1, wherein the first impedance match module includes fixed or variable capacitors and capacitance values associated with the fixed or variable capacitors are selected for a first match impedance associated with the first impedance match module to match a first load impedance associated with the load during the first time period.

10. The system of claim 9, wherein the second impedance match module includes second fixed or variable capacitors and capacitance values associated with the second fixed or variable capacitors are selected for a second match impedance associated with the second impedance match module to match a second load impedance associated with the load during the second time period, wherein the first and second load impedances are different from each other.

11. The system of claim 1, wherein the plurality of electrode plates is disposed above the conveyor and distributed along the length of the conveyor, and wherein a last electrode plate of the plurality of electrode plates is associated with causing the load to be at the end temperature.

12. The system of claim 1, wherein the conveyor moves continuously to position the load from the first electrode plate to the second electrode plate.

13. The system of claim 1, wherein the conveyor moves incrementally to position the load from the first electrode plate to the second electrode plate.

14. An apparatus comprising:
means for positioning a load to electrically couple with a first electrode plate for a first time period, wherein a first means to match impedance is electrically coupled between the first electrode plate and a first radio frequency (RF) generator, and wherein the first means to match impedance is associated with a first range of temperatures between a start temperature and an end temperature associated with the load;
means for applying a first RF signal to the load for a portion of the first time period during which the load is at a temperature within the first range of temperatures, the first RF signal comprising a RF signal generated by the first radio frequency RF generator and impedance matched by the first means to match impedance;
means for positioning the load to electrically couple with a second electrode plate for a second time period, wherein a second means to match impedance is electrically coupled between the second electrode plate and a second RF generator, and wherein the second means to match impedance is associated with a second range of temperatures between the start and end temperatures different from the first range of temperatures; and
means for applying a second RF signal to the load for a portion of the second time period during which the load is at a temperature within the second range of temperatures, the second RF signal comprising another RF signal generated by the second RF generator and impedance matched by the second means for matching impedance.

15. The apparatus of claim 14, further comprising:
means for generating a first DC signal and applying the first DC signal to drive the first RF generator; and
means for generating a second DC signal and applying the second DC signal to device the second RF generator.

16. The apparatus of claim 14, wherein the first RF signal comprises a signal having a DC to RF power efficiency of 75 to 80%, and wherein a power of the first RF signal is up to approximately 10 kiloWatt (kW).

17. The apparatus of claim 14, further comprising:
means for receiving, from the first radio frequency RF generator, an indication of a first reflected power level associated with processing of the load using the first RF generator, means for matching impedance, and electrode plate;
means for determining whether the indication of the first reflected power level exceeds a threshold; and
when the determination is affirmative, means for causing the load to be positioned to electrically couple with the second electrode plate.

18. The apparatus of claim 17, wherein when the determination is negative, means for changing a first match impedance associated with the first means for matching impedance, wherein the first match impedance is changed for the next first reflected power level to be smaller than the first reflected power level.

19. The apparatus of claim 18, wherein the means for changing the first match impedance associated with the first means for changing impedance comprises means for adjusting a capacitance of one or more variable capacitors included in the first means for matching impedance.

20. The apparatus of claim 14, wherein the end temperature is between −4 to −2° Celsius (C), a temperature below 0° C., or a temperature below at which drip loss occurs for the load, and wherein a total time period for the load to heat from the start temperature to the end temperature comprises less than an hour.

* * * * *